United States Patent
Ishimaru et al.

(10) Patent No.: US 9,654,094 B2
(45) Date of Patent: May 16, 2017

(54) SEMICONDUCTOR SWITCH CIRCUIT AND SEMICONDUCTOR SUBSTRATE

(71) Applicant: Kabushiki Kaisha Toshiba, Minato-ku, Tokyo (JP)

(72) Inventors: Atsushi Ishimaru, Yokohama Kanagawa (JP); Keita Masuda, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/473,021

(22) Filed: Aug. 29, 2014

(65) Prior Publication Data
US 2015/0263721 A1    Sep. 17, 2015

(30) Foreign Application Priority Data

Mar. 12, 2014  (JP) ................ 2014-049264
Aug. 22, 2014  (JP) ................ 2014-169877

(51) Int. Cl.
*H03K 17/693*   (2006.01)
*H03K 17/16*    (2006.01)

(52) U.S. Cl.
CPC ......... *H03K 17/161* (2013.01); *H03K 17/693* (2013.01)

(58) Field of Classification Search
CPC .. H01L 27/0218; H03K 17/16; H03K 17/161; H03K 17/162; H03K 17/6872; H03K 17/6874; H03K 19/00361
USPC ....................................... 327/382
See application file for complete search history.

(56) References Cited

U.S. PATENT DOCUMENTS

| | | |
|---|---|---|
| 5,731,607 A | 3/1998 | Kohama |
| 5,825,227 A | 10/1998 | Kohama et al. |
| 5,929,488 A | 7/1999 | Endou |
| 6,452,249 B1 | 9/2002 | Maeda et al. |
| 7,129,142 B2 | 10/2006 | Wristers et al. |
| 7,919,861 B2 | 4/2011 | Matsuzaki |
| 8,119,474 B2 | 2/2012 | Bryant et al. |
| 8,134,224 B2 | 3/2012 | Sagae et al. |
| 8,492,868 B2 | 7/2013 | Botula et al. |
| 8,649,741 B2 | 2/2014 | Iijima et al. |
| 2011/0221510 A1 | 9/2011 | Botula et al. |
| 2011/0221519 A1 | 9/2011 | Katoh et al. |
| 2013/0009725 A1 | 1/2013 | Heaney et al. |
| 2013/0270640 A1 | 10/2013 | Sagae et al. |

FOREIGN PATENT DOCUMENTS

| | | |
|---|---|---|
| JP | H07-283414 A | 10/1995 |
| JP | H08-204530 A | 8/1996 |
| JP | H08-293776 A | 11/1996 |

(Continued)

*Primary Examiner* — John Poos
*Assistant Examiner* — David Mattison
(74) *Attorney, Agent, or Firm* — White & Case LLP

(57) ABSTRACT

According to one embodiment, a semiconductor switch circuit includes a semiconductor substrate, an insulating film, a semiconductor layer, a first wiring line, a semiconductor switch unit, and a first conductor. The insulating film is provided on the semiconductor substrate. The semiconductor layer is provided on the insulating film. The first wiring line is provided above the insulating film. The semiconductor switch unit is provided on the semiconductor layer and is electrically connected to the first wiring line. The first conductor is provided between the first wiring line and the semiconductor substrate.

19 Claims, 24 Drawing Sheets

(56) References Cited

FOREIGN PATENT DOCUMENTS

| | | | |
|---|---|---|---|
| JP | H08-316420 | A | 11/1996 |
| JP | 2001-308273 | A | 11/2001 |
| JP | 2005-536037 | A | 11/2005 |
| JP | 2006-19612 | A | 1/2006 |
| JP | 2007-005782 | A | 1/2007 |
| JP | 2008-227084 | A | 9/2008 |
| JP | 2009-502042 | A | 1/2009 |
| JP | 2010-153786 | A | 7/2010 |
| JP | 2011-193191 | A | 9/2011 |
| JP | 2011-258642 | A | 12/2011 |
| JP | 2012-010246 | A | 1/2012 |
| JP | 2012-015538 | A | 1/2012 |
| JP | 2012-065041 | A | 3/2012 |
| JP | 2013-507873 | A | 3/2013 |
| JP | 2013-191752 | A | 9/2013 |
| JP | 2013-537715 | A | 10/2013 |
| WO | 2012/018664 | A1 | 2/2012 |

SEMICONDUCTOR SWITCH CIRCUIT AND SEMICONDUCTOR SUBSTRATE

CROSS REFERENCE TO RELATED APPLICATION

This application is based upon and claims the benefit of priority from the prior Japanese Patent Application No. 2014-049264, filed on Mar. 12, 2014, and the prior Japanese Patent Application No. 2014-169877, filed on Aug. 22, 2014, the entire contents of which are incorporated herein by reference.

FIELD

Embodiments described herein relate generally to a semiconductor switch circuit and a semiconductor substrate.

BACKGROUND

In a portable apparatus, a radio frequency switch circuit to switch an antenna into an antenna for transmission or an antenna for reception has been used.

In the related art, a semiconductor switch circuit having an insulated gate field effect transistor (MOS transistor) has been used as the radio frequency switch circuit.

The semiconductor switch circuit is effectively provided in a silicon on insulator (SOI) substrate in which a semiconductor layer is provided on a semiconductor substrate with an insulating film interposed therebetween.

The semiconductor substrate having high resistance enables a parasitic capacity of a radio frequency circuit and the semiconductor substrate to decrease, so that an operation speed of the semiconductor switch circuit increases.

However, in the semiconductor switch circuit provided on the SOI substrate, harmonic distortion occurs due to a radio frequency signal.

DETAILED DESCRIPTION

Figure 1:
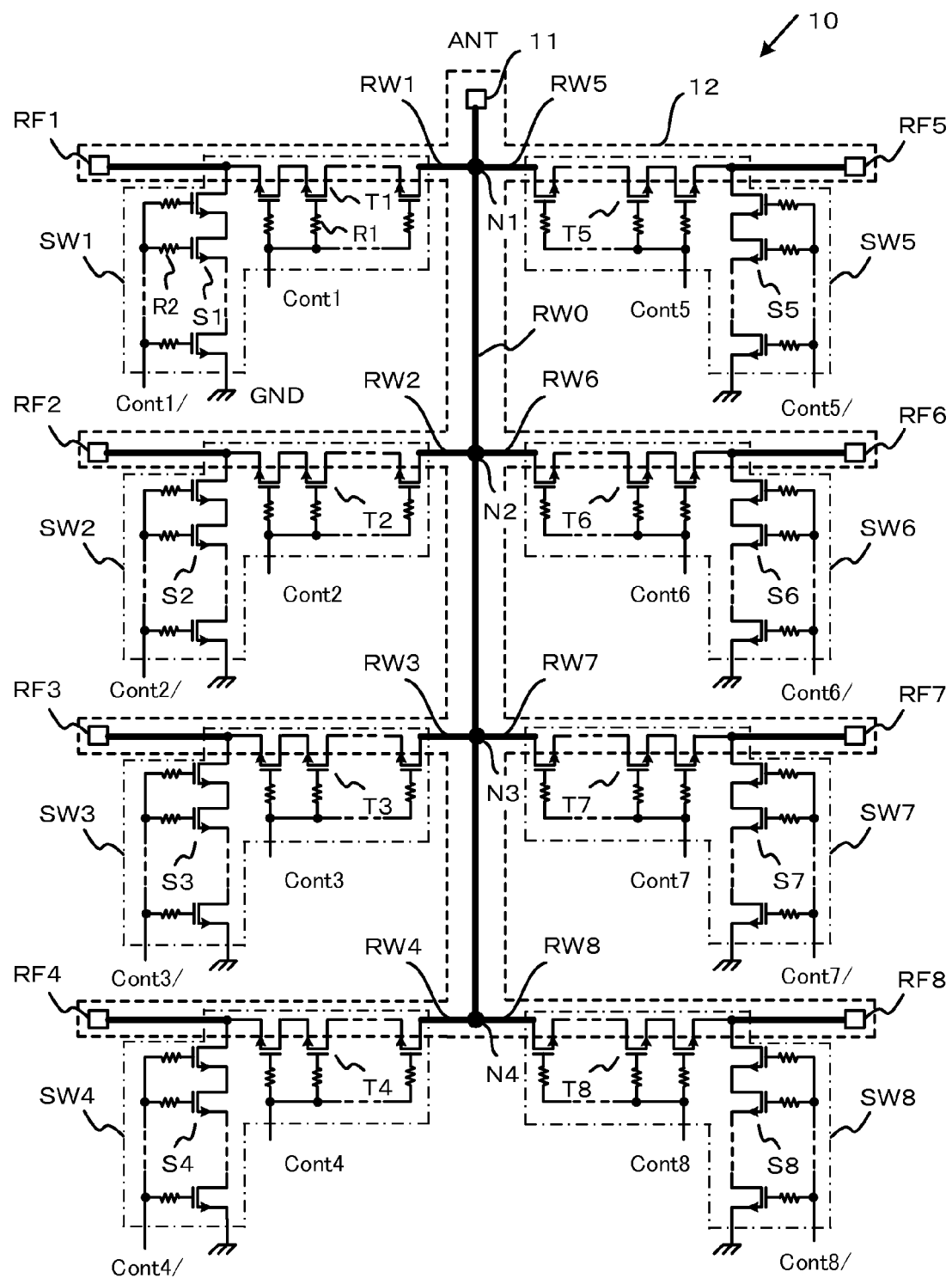
FIG. 1 is a circuit diagram showing a semiconductor switch circuit according to a first embodiment.

According to one embodiment, a semiconductor switch circuit includes a semiconductor substrate, an insulating film, a semiconductor layer, a first wiring line, a semiconductor switch unit, and a first conductor. The insulating film is provided on the semiconductor substrate. The semiconductor layer is provided on the insulating film. The first wiring line is provided above the insulating film. The semiconductor switch unit is provided on the semiconductor layer and is electrically connected to the first wiring line. The first conductor is provided between the first wiring line and the semiconductor substrate.

Hereinafter, embodiments will be described with reference to the drawings. In the drawings, same reference characters denote the same or similar portions. The detailed description of the same reference characters is arbitrarily omitted, and only different reference characters are described.

First Embodiment

Figure 2:
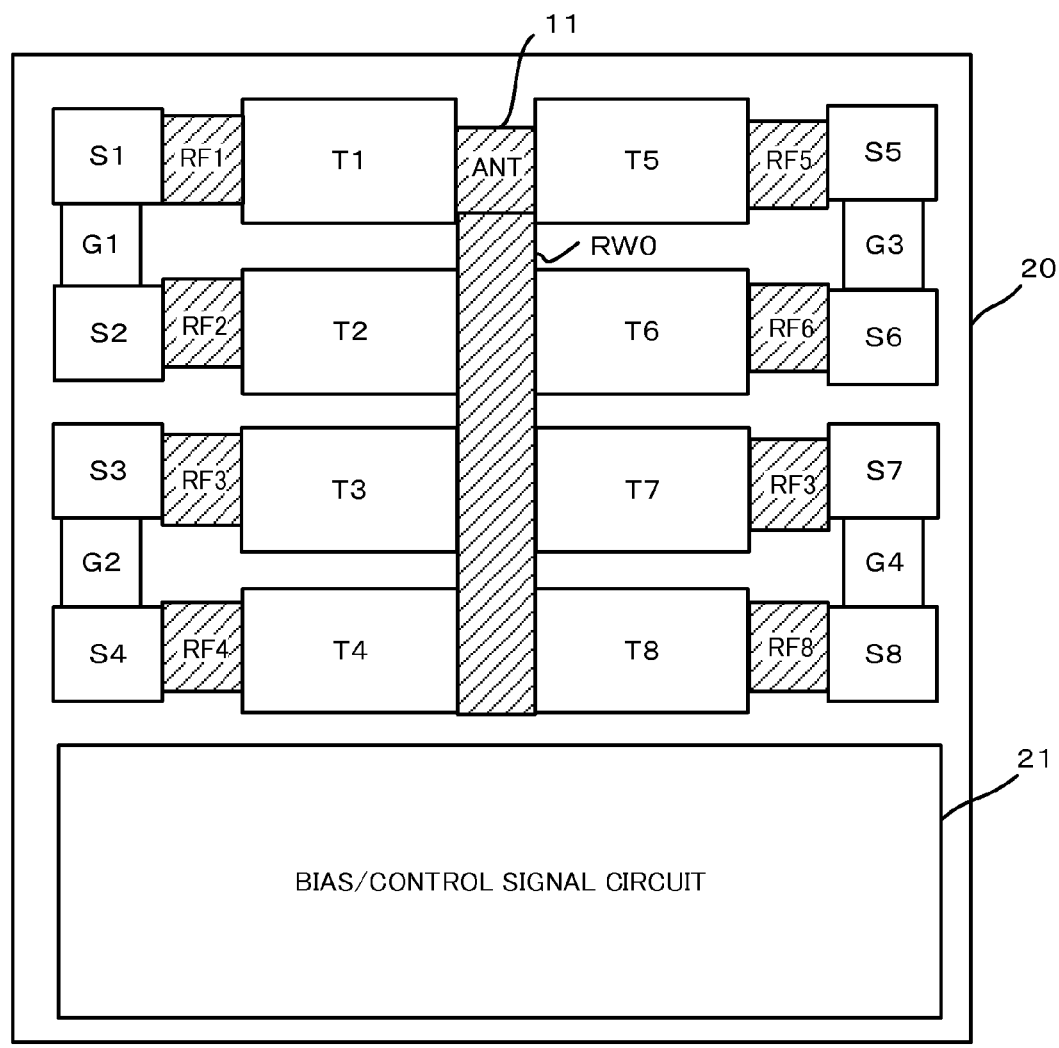
FIG. 2 is a plan view showing a semiconductor chip provided with the semiconductor switch circuit according to the first embodiment.
Figure 3:
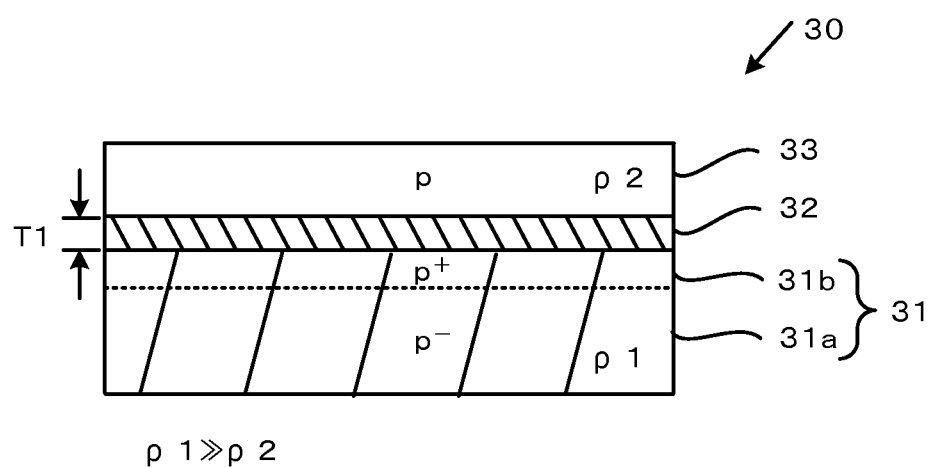
FIG. 3 is a diagram showing a silicon on insulator (SOI) substrate provided with the semiconductor switch circuit according to the first embodiment.
Figure 4A:
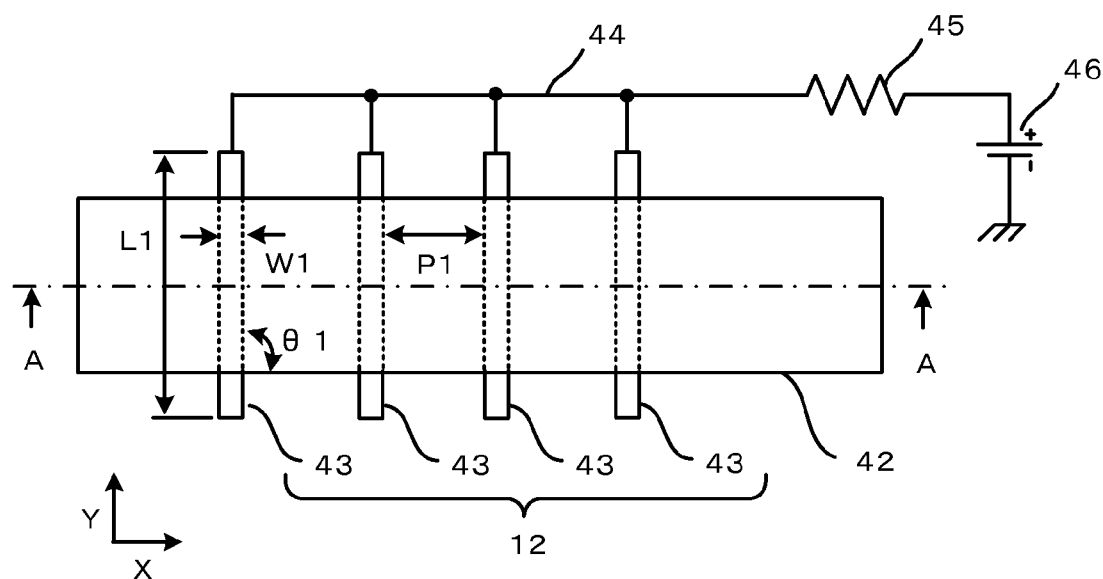
FIGS. 4A and 4B are diagrams showing a main portion of the semiconductor switch circuit according to the first embodiment.
Figure 4B:
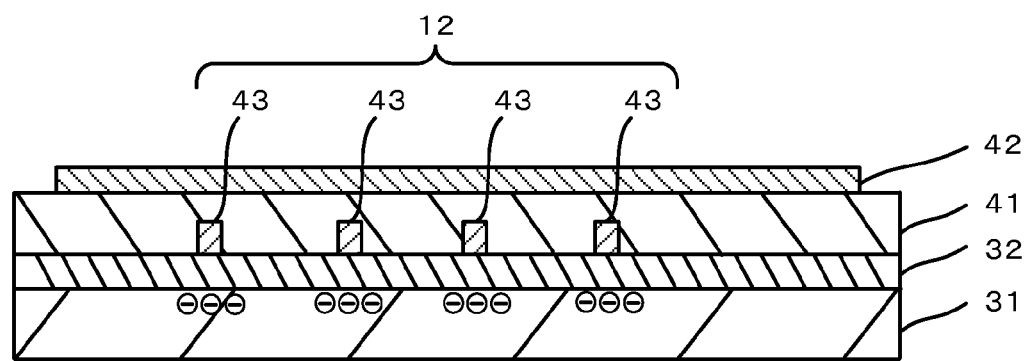

A semiconductor switch circuit in accordance with a first embodiment will be described with reference to FIGS. 1 to 4. FIG. 1 is a circuit diagram showing the semiconductor switch circuit of the embodiment. FIG. 2 is a plan view showing a semiconductor chip provided with the semiconductor switch circuit. FIG. 3 is a cross-sectional view showing a silicon on insulator (SOI) substrate provided with the semiconductor switch circuit. FIGS. 4A and 4B are diagrams showing a bias line provided below a radio frequency transmission line of the semiconductor switch circuit. FIG. 4A is a plan view showing the bias line and FIG. 4B is a cross-sectional view taken along the line A-A of FIG. 4A and viewed in a direction of arrow.

The semiconductor switch circuit of the embodiment is a radio frequency switch circuit to switch an antenna into an antenna for transmission or an antenna for reception in a portable apparatus and is a multi-port bi-directional switch circuit that has one input (output) terminal (common terminal) and a plurality of output (input) terminals (individual terminals).

First, the outline of the semiconductor switch circuit will be described.

As shown in FIGS. 1 to 4, a semiconductor switch circuit 10 of the embodiment is provided on a silicon on insulator (SOI) substrate 30. Each semiconductor switch unit (SW1 to SW8) is provided between an antenna terminal 11 and each radio frequency terminal (RF1 to RF8). The semiconductor switch unit (SW1 to SW8) is connected to the antenna terminal 11 and the radio frequency terminal (RF1 to RF8) by a radio frequency transmission line (first wiring line, RW0 to RW8). A bias line (first conductor) 12 is provided below the radio frequency transmission line (RW0 to RW8). The bias line 12 is also provided below the antenna terminal 11 and the radio frequency terminal. The bias line 12 is biased positively to a silicon substrate 31.

In the SOI substrate 30, charges (electrons) are easily accumulated in the vicinity of an interface of a silicon oxide film 32 and the silicon substrate 31. When a radio frequency signal flows to the radio frequency transmission line, the charges are accelerated by an electric field caused due to a radio frequency and are moved. In the radio frequency signal, harmonic distortion occurs due to the movement of the charges.

Because the bias line 12 draws the charges in the vicinity of the interface by the Coulomb force, the bias line 12 can prevent the charges from moving, even though the radio frequency signal flows to the radio frequency transmission line.

A second portion 31b of the silicon substrate 31 that contacts the silicon oxide film 32 has a higher impurity concentration than a first portion 31a, and a higher acceptor concentration. Because the acceptors of the second portion 31b neutralize the charges in the vicinity of the interface, a charge density of the interface can be decreased.

Therefore, the harmonic distortion can be decreased with a synergy effect of both sides. In the case of the semiconductor switch circuit in which many ports are provided and a total distance of the radio frequency transmission lines is long, an effect of preventing the distortion of the radio frequency signal increases.

Next, the detail of the semiconductor switch circuit 10 will be described.

As shown in FIG. 1, the antenna terminal (common terminal) 11 and the eight radio frequency terminals (individual terminals) RF1, RF2, RF3, RF4, RF5, RF6, RF7, RF8 are provided in the semiconductor switch circuit 10. The main radio frequency transmission line RW0 that reaches from the antenna terminal 11 to a node N4 via nodes N1, N2, N3 is provided.

The radio frequency transmission line RW1 connects the node N1 with the radio frequency terminal RF1 by way of the semiconductor switch unit SW1.

Likewise, the radio frequency transmission lines RW2 to RW8 connects the node N1 with the radio frequency terminals RF2 to RF8 by way of the semiconductor switch units SW2 to SW8, respectively.

The radio frequency signal has a frequency of 700 MHz or more and power of 20 dBm or more, for example. The radio frequency signal is modulated by a universal mobile telecommunication system (UMTS), for example.

Hereinafter, the radio frequency transmission line RW1 will be mainly described. However, the description is applicable to the radio frequency transmission lines RW2 to RW8 and the description of the radio frequency transmission lines RW2 to RW8 is omitted.

The radio frequency transmission line RW1 connects the node N1 with the radio frequency terminal RF1 by way of the semiconductor switch unit SW1. The semiconductor switch unit SW1 has MOS transistors (hereinafter, referred to as a through transistor) T1 connected in series between the node N1 and the radio frequency terminal RF1 and MOS transistors (hereinafter, referred to as a shunt transistor) S1 connected in series between the radio frequency terminal RF1 and a ground terminal GND.

A resistor R1 to stabilize a switching operation (to prevent an oscillation) is connected to a gate terminal of each through transistor T1. The resistor R1 has a high resistance value at which the radio frequency signal does not leak in a bias/control signal circuit 21 to be described below. A resistor R2 to prevent the radio frequency signal from leaking is also connected to a gate terminal of each shunt transistor S1. Each of the resistors R1, R2 has resistance of 100 kΩ or more.

A control signal Cont1 is applied to the gate terminal of each through transistor T1. A control signal Cont1/ obtained by inverting the control signal Cont1 is applied to the gate terminal of each shunt transistor S1. Therefore, the through transistor T1 and the shunt transistor S1 enter a conductive state or a non-conductive state complementarily.

For example, the through transistor T1 is made to enter the conductive state and the shunt transistor S1 is made to enter the non-conductive state, to cause the antenna terminal 11 and the radio frequency terminal RF1 to enter the conductive state. At the same time, all of the through transistors T2 to T8 are made to enter the non-conductive state and all of the shunt transistors S2 to S8 are made to enter the conductive state.

A bias line (first conductor) 12 is provided in a region surrounded by a broken line, below the radio frequency transmission lines RW0 to RW8 and above the silicon substrate 31. The bias line 12 is provided below the antenna terminal 11 and the radio frequency terminals RF1 to RF8 and above the silicon substrate 31.

That is, the bias line 12 is not in contact with the radio frequency transmission lines RW0 to RW8 and the silicon substrate 31. The bias line 12 is not provided below the semiconductor switch units SW1 to SW8.

The bias line 12 has a potential higher than a potential of the silicon substrate 31. Specifically, the bias line 12 is biased positively to the silicon substrate 31. The bias line 12 is connected to a positive power supply 46 through a resistor 45 for radio frequency signal leakage prevention, to become floating, in terms of radio frequency. The resistor 45 may have resistance of 20 kΩ or more, for example.

FIG. 2 is a plan view of a semiconductor chip, and shows a schematic configuration of each of the semiconductor switch units and wiring lines. However, a size of each of the semiconductor switch units and a width of each of the wiring lines are particularly not limited to those shown in FIG. 2. The antenna terminal 11, the radio frequency terminals RF1 to RF8, the ground terminals G1 to G4, the through transistors T1 to T8, and the shunt transistors S1 to S8 are arranged at one side of the semiconductor chip 20 in plan view.

The ground terminal G1 is connected commonly to the shunt transistors S1, S2 arranged at both sides. A connection relation of the ground terminal G1 is applicable to the ground terminals G2, G3, G4 and the description of the ground terminals G2, G3, G4 is omitted.

The bias/control signal circuit 21 which generates the voltage, the control signals Cont1 to Cont8, and the inversion control signals Cont1/ to Cont8/ and controls the semiconductor switch circuit 10 is arranged at the other side of the semiconductor chip 20 in plan view. The voltage is applied to the bias line 12.

A hatched region in FIG. 2 shows a region in which the bias line 12 is provided. The bias line 12 having a shape and a spacing to be described below is provided in the region.

As shown in FIG. 3, the SOI substrate 30 has a p-type silicon substrate (semiconductor substrate) 31 that has first specific resistance $\rho 1$, a silicon oxide film (insulating film) 32 that is provided on the silicon substrate 31, and a p-type silicon layer (semiconductor layer) 33 that is provided on the silicon oxide film 32 and has second specific resistance $\rho 2$ lower than the first specific resistance $\rho 1$.

Since the silicon substrate 31 is merely a support substrate, it is preferable that the first specific resistance $\rho 1$ is higher than the second specific resistance $\rho 2$ in order to reduce a parasitic capacitance of the silicon layer 33 which is an active layer.

The silicon substrate 31 has a first portion 31a that has the first specific resistance $\rho 1$ and a second portion 31b that is provided on the first portion 31a and contains impurities of an impurity concentration higher than the impurity concentration of the first portion 31a. The second portion 31b is in contact with the silicon oxide film 32. A thickness of the second portion 31b is approximately 0.5 to 1 μm, for example.

The first specific resistance $\rho 1$ is 1 kΩ·cm or more, for example. The second specific resistance $\rho 2$ is approximately 10 Ω·cm, for example. A thickness T1 of the silicon oxide film 32 is approximately 1 to 2 μm, for example. A thickness of the silicon layer 33 is approximately 0.1 to 1 μm, for example.

The silicon oxide film 32 is also called a buried oxide (BOX) layer. The silicon layer 33 is also called an SOI layer.

The impurities of the second portion 31b are boron (B) becoming acceptors, for example. The acceptors generate holes. Because the charges (electrons) accumulated in the vicinity of the interface of the silicon oxide film 32 and the silicon substrate 31 are neutralized by the holes, the charge density in the vicinity of the interface decreases.

FIG. 4A shows a positional relationship between the radio frequency transmission lines (RW0 to RW8) and the bias line 12(43). FIG. 4B is a diagram explaining a relationship between bias line 12 and the charges in the silicon substrate.

As shown in FIGS. 4A and 4B, the bias line 12 is provided on the silicon oxide film 32 exposed by removing a portion of the silicon layer 33. An interlayer insulating film 41 is provided on the silicon layer 33 to cover the bias line 12. The radio frequency transmission line 42 is provided on the interlayer insulating film 41.

The bias line 12 has a plurality of strip-shaped wiring lines (linear objects) 43 with a length of L1 and a width of W1. The wiring lines 43 extend to be closer to the outside than an edge of the radio frequency transmission line 42, in a direction having a predetermined angle $\theta 1$ for an X direction (first direction) in which the radio frequency transmission line 42 extends in planar view. In this case, the direction is a Y direction (second direction) vertical ($\theta 1=90°$) to the X direction. The wiring lines 43 are arranged at a predetermined interval P1 in the X direction.

In each of the wiring lines 43, one end is connected commonly to an extraction wiring line 44 and the other end is opened. The wiring line 44 is connected to a power supply 46 through the resistor 45 for the radio frequency signal leakage prevention. The power supply 46 applies a positive voltage to the wiring lines 43.

The charges of the interface of the silicon oxide film 32 and the silicon substrate 31 are attracted below the wiring lines 43 and the free movement of the charges is restricted.

The reason why the bias line 12 includes the strip-shaped wiring lines 43 is to decrease the parasitic capacity between the radio frequency transmission line 42 and the bias line 12. Specifically, when the parasitic capacity excessively increases, a radio frequency current also flows to the bias line 12 through the parasitic capacity. Therefore, an effect of suppressing the charge movement decreases.

The reason why the wiring lines 43 extend to be closer to the outside than the edge of the radio frequency transmission line 42 is to suppress the charges from being moved by the radio frequency field leaking from the radio frequency transmission line 42 to a surrounding portion of the radio frequency transmission line 42. Even though the wiring lines 43 do not extend to be closer to the outside than the edge of the radio frequency transmission line 42, an effect of the embodiment can be obtained.

Therefore, the length L1 and the width W1 of the wiring line 43, the predetermined angle $\theta 1$, and the predetermined interval P1 may be appropriately determined in a range in which the targeted effect is obtained. In addition, the predetermined angle $\theta 1$ is not limited in particular. The predetermined interval P1 may not be constant.

Figure 5A:
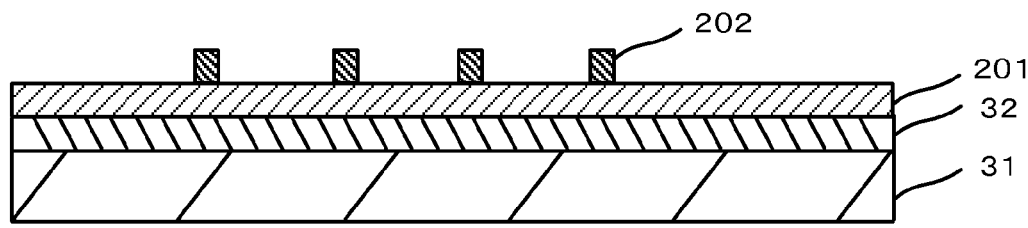
FIGS. 5A to 5C are cross-sectional views sequentially showing steps of forming the main portion of the semiconductor switch circuit according to the first embodiment.
Figure 5B:
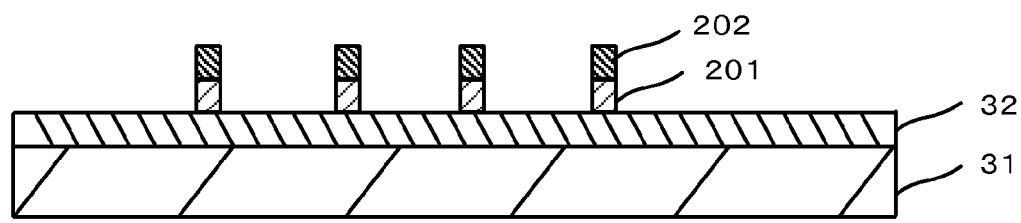
Figure 5C:
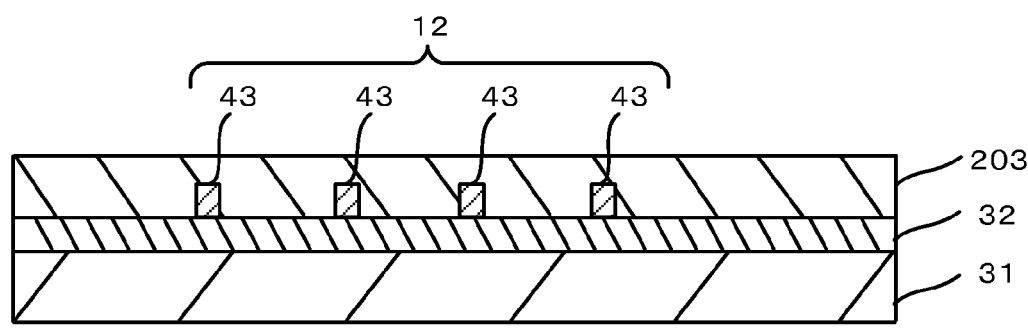

Next, a method of forming the bias line 12 will be described. FIGS. 5A to 5C are cross-sectional views sequentially showing steps of forming the bias line 12.

As shown in FIG. 5A, a metal film is formed as a conductive film 201 on the silicon oxide film 32 exposed by removing the silicon layer 33, by a sputtering method. A resist film 202 corresponding to a pattern of the wiring line 43 is formed on the conductive film 201 by a photolithography method.

As shown in FIG. 5B, the conductive film 201 is etched using the resist film 202 as a mask, by a reactive ion etching (RIE) method. The conductive film 201 that has not been etched becomes the wiring line 43 shown in FIGS. 4A and 4B.

As shown in FIG. 5C, a tetra ethel ortho silicate (TEOS) film 203 is formed on the silicon oxide film 32 to cover the wiring line 43, by a chemical vapor deposition (CVD) method, after the resist film 202 is removed. The TEOS film 203 becomes the interlayer insulating film 41. A metal film is formed as a radio frequency transmission line 42 on the TEOS film 203, by the sputtering method.

The SOI substrate 30 is obtained by a separation by implantation of oxygen (SIMOX) method or a lamination method. The acceptors of the high concentration of the second portion 31b are obtained by an ion implantation method using the silicon oxide film 32.

As described above, the semiconductor switch circuit 10 according to the embodiment has a bias line 12 biased positively to the silicon substrate 31 below the radio frequency transmission line 42 and above the silicon substrate 31.

Therefore, the charges induced on the interface of the silicon substrate 31 and the silicon oxide film 32 are drawn to the bias line 12 and the charges are suppressed from being moved by the radio frequency signal flowing to the radio frequency transmission line 42. As a result, the distortion can be prevented from occurring in the radio frequency signal, by a synergy effect with reduction of an interface charge density by the high concentration acceptors of the second portion 31b. In addition, power loss of the radio frequency transmission line 42 can be decreased.

In addition, an effect of suppressing the movement of the charges of the interface by the bias line 12 can be obtained, even though the high concentration acceptors are not contained in the second portion 31b of the silicon substrate 31.

Figure 6A:
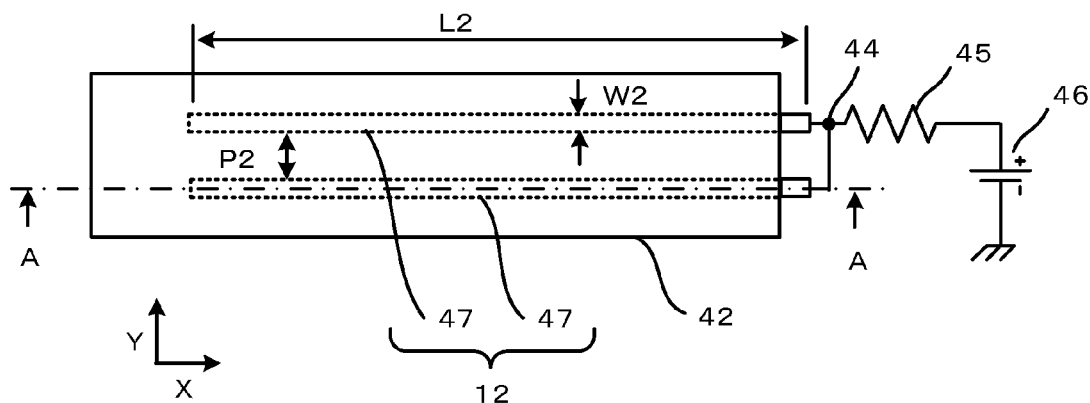
FIGS. 6A and 6B are diagrams showing another main portion of the semiconductor switch circuit according to the first embodiment.
Figure 6B:
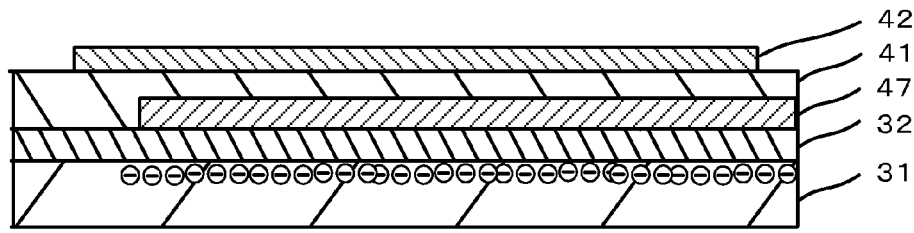

In the embodiment, the case in which the wiring line 43 extends in a direction having a predetermined angle θ1 with respect to the X direction has been described. However, the extension direction may be the X direction (θ1=0°). FIGS. 6A and 6B are diagrams showing a bias line having a plurality of wiring lines extending in the X direction. FIG. 6A is a plan view of the bias line and FIG. 6B is a cross-sectional view taken along the line A-A of FIG. 6A and viewed in a direction of arrow.

As shown in FIGS. 6A and 6B, the bias line 12 has a plurality of wiring lines 47 that extend in the X direction and have a length of L2 and a width of W2. The wiring lines 47 are arranged at a predetermined interval P2 in the Y direction.

One end of the wiring lines 47 extends to be closer to the outside than the edge of the X direction of the radio frequency transmission line 42 and is connected commonly to the wiring line 44. The other ends of the wiring lines 47 are opened. The wiring lines 47 are connected to the power supply 46 through the resistor 45 for the radio frequency signal leakage prevention.

The power supply 46 applies a positive voltage to the wiring lines 47. The charges which are generated on the interface of the silicon oxide film 32 and the silicon substrate 31 are drawn below the wiring lines 47 and free movement of the charges is restricted.

The length L2, the width W2, and the predetermined interval P2 of the wiring lines 47 may be appropriately determined in a range in which a targeted effect is obtained.

The case in which the bias line 12 is a metal film provided on the silicon oxide film 32 has been described. However, the bias line 12 can be formed of the same material as a channel layer of the through transistors T1 to T8 and the shunt transistors S1 to S8 or the gate wiring line.

Figure 7A:
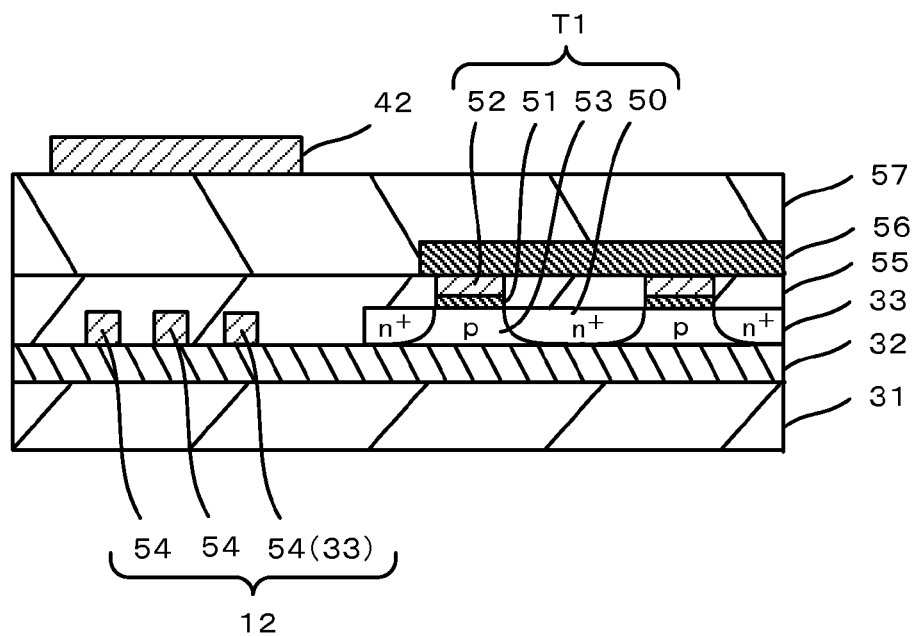
FIGS. 7A and 7B are diagrams showing another main portion of the semiconductor switch circuit according to the first embodiment.
Figure 7B:
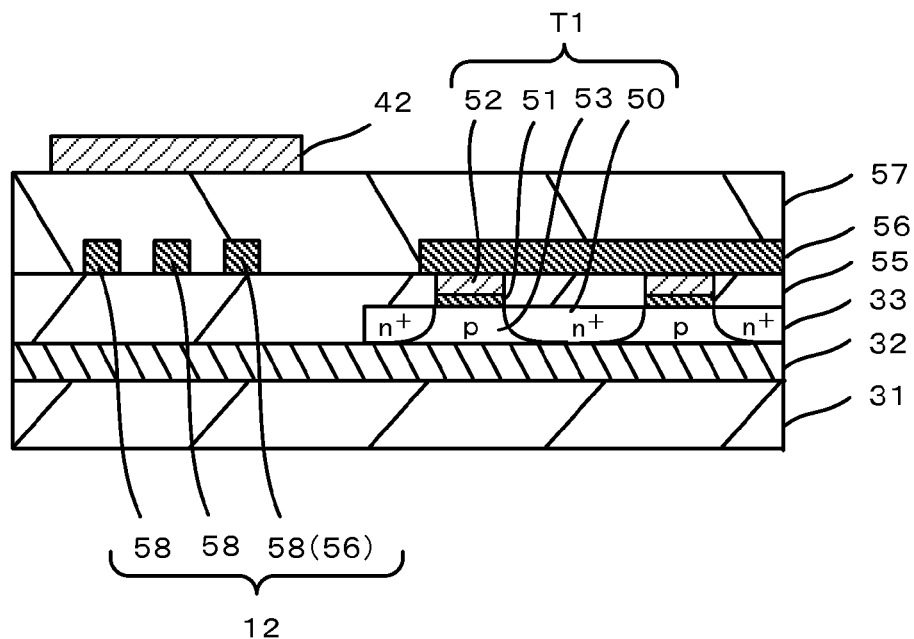

FIG. 7A is a cross-sectional view showing the bias line formed of the same material as the channel layer. FIG. 7B is a cross-sectional view showing the bias line formed of the same material as the gate wring line.

As shown in FIG. 7A, the through transistor T1 has a pair of source/drain layers 50 provided in a region obtained by processing the silicon layer 33 in an island shape, a gate insulating film 51 provided on the silicon layer 33 between the source/drain layers 50, and a gate electrode 52 provided on the gate insulating film 51.

The silicon layer 33 below the gate insulating film 51 is the channel layer 53. The through transistors T1 are connected in series to commonly use the source/drain layers 50.

The bias line 12 has the wiring lines 54 obtained by processing the silicon layer 33 in a strip shape, similar to the island processing of the silicon layer 33.

An interlayer insulating film 55 is provided to cover the through transistor T1 and the bias line 12, on the silicon oxide film 32 exposed by the island processing of the silicon layer 33 and the strip processing of the silicon layer 33. A gate wiring line 56 to which the gate electrode 52 is connected commonly through the resistor R1 (not shown in the drawings) is provided on the interlayer insulating film 55.

An interlayer insulating film 57 is provided on the interlayer insulating film 55 to cover the gate wiring line 56. A radio frequency transmission line 42 is provided on the interlayer insulating film 57.

Therefore, the wiring lines 54 are formed of the same material as the channel layer 53 and are arranged on the same plane. The bias line 12 is arranged below the radio frequency transmission line 42 and above the silicon substrate 31.

A process for processing the silicon layer 33 in an island shape and a process for processing the silicon layer 33 in a strip shape can be executed simultaneously by the photolithography method and the RIE method.

As shown in FIG. 7B, the gate wiring line 56 is obtained by processing the gate wiring line material provided on the interlayer insulating film 55, for example, polysilicon to which impurities are doped in a gate wiring line pattern. A plurality of wiring lines 58 of the bias line 12 is obtained by processing the gate wiring line material in a strip shape.

Therefore, the wiring lines 58 are formed of the same material as the gate wiring line 56 and are arranged on the same plane. The bias line 12 is provided below the radio frequency transmission line 42 and above the silicon substrate 31.

A process for processing the gate wiring line material in a gate wiring line pattern and a process for processing the gate wiring line material in a strip shape can be performed simultaneously by the photolithography method and the RIE method.

A material of the conductive film 201 is not limited in particular. A refractory metal film, a silicide film of a refractory metal and the like can be used as the material of the conductive film 201.

In addition, the wiring lines 43, 47 can be formed by a damascene method of forming a trench in an insulating film and filling the trench with a conductive film.

The case in which the wiring lines 43, 47 have a strip shape or a line shape has been described. However, shapes of the wiring lines 43, 47 are not limited in particular. In the wiring lines 43, 47, other shapes, for example, an S shape, a zigzag shape, and a lattice shape can be used.

The case in which the second portion 31b and the silicon oxide film 32 are in contact with each other has been described. However, other layer, for example, a modified layer can be provided between the second portion 31b and the silicon oxide film 32. The modified layer is made of silicon including crystal defects, for example. Because the probability that the crystal defects of the modified layer trap the charges of the interface becomes high, the movement of the charges in the vicinity of the interface can be further suppressed.

The modified layer can be formed as follows. A pulsed laser beam transmitting the silicon oxide film is radiated from the side of the silicon oxide film 32.

Because the second portion 31b absorbs a laser beam and is locally melted and solidified, a part of the second portion 31b becomes the modified layer. Because the silicon layer 33 is thin, an influence of absorption of the laser beam in the silicon layer 33 can be ignored.

In addition, a short-pulsed laser beam with a high-repetition transmitting the silicon oxide film and the silicon is radiated and is focused on the surrounding portion of the interface to a diffraction limit level. The laser beam is compressed temporally or spatially in an extremely local region in the vicinity of a focal point and has a very high peak power density.

The laser beam transmitting the silicon shows a very high absorption characteristic locally, when the peak power density is more than a threshold value in the course of condensing. By controlling the peak power density such that the peak power density is more than the threshold value in only a surrounding portion of the focal point in the vicinity of the interface, a part of the second portion 31b becomes the modified layer without damaging the silicon layer 33.

The modified layer does not need to be provided on an entire surface of the SOI substrate 30. The modified layer may be provided in only a necessary region below the radio frequency transmission line 42.

As another example, other silicon layer may be provided between the silicon oxide film 32 and the silicon layer 33. The other silicon layer is a layer having a different impurity concentration or a layer having a different conductive type, for example. The semiconductor switch units SW1 to SW8 may be configured employing junction field effect transistors.

Second Embodiment

Figure 8A:
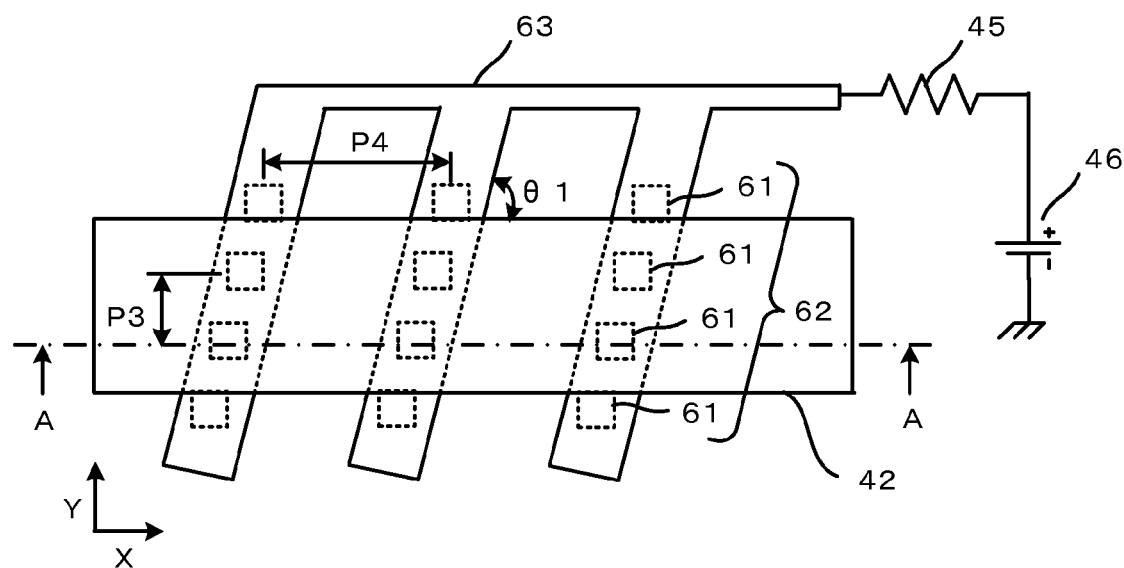
FIGS. 8A and 8B are diagrams showing a main portion of a semiconductor switch circuit according to a second embodiment.
Figure 8B:
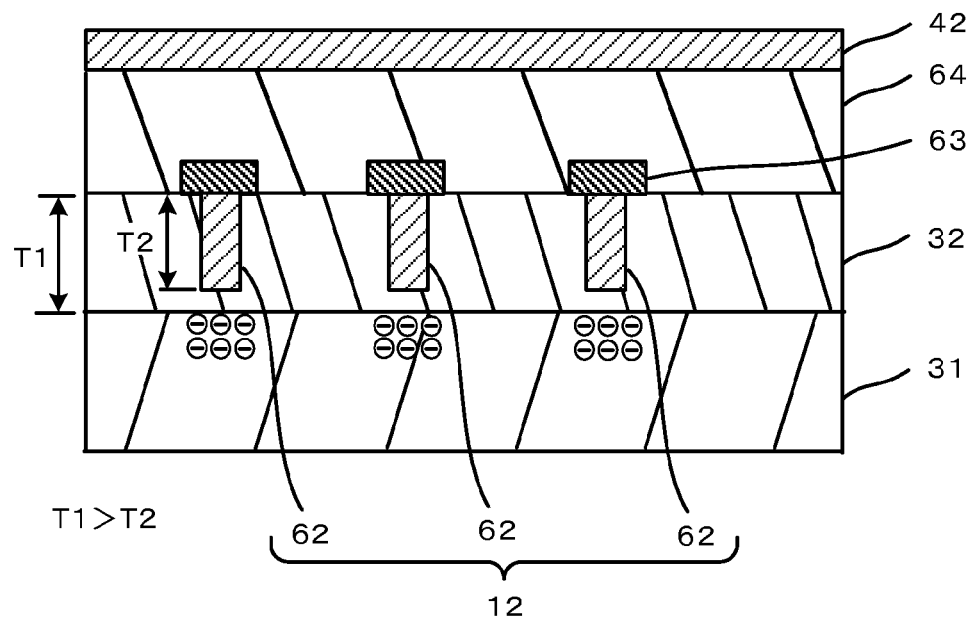

A semiconductor switch circuit in accordance with a second embodiment will be described with reference to FIGS. 8A and 8B. FIGS. 8A and 8B are diagrams showing a bias line of the semiconductor switch circuit of the embodiment. FIG. 8A is a plan view of the bias line and FIG. 8B is a cross-sectional view taken along the line A-A of FIG. 8A and viewed in a direction of arrow.

In the embodiment, the same components as those of the first embodiment are denoted with the same reference numerals, the description of the same components is omitted, and only different components are described. The embodiment is different from the first embodiment in that a bias line has a plurality of columnar objects.

As shown in FIGS. 8A and 8B, a plurality of vias (columnar objects) 61 reaching from the side of a silicon layer 33 to an inner portion of a silicon oxide film 32 are provided in the semiconductor switch circuit of the embodiment. A top surface of the via 61 is on substantially the same plane as a top surface of the silicon oxide film 32. The via 61 does not penetrate the silicon oxide film 32. A thickness of the silicon oxide film 32 is set as T1 and a length of the via 61 is set as T2. The length T2 is smaller than the thickness T1 (T1>T2).

The vias 61 are arranged obliquely at a predetermined angle θ1 with respect to an X direction in which a radio frequency transmission line 42 extends in plan view. The vias 61 are arranged at a predetermined interval P3 in a Y direction. A group of vias 61 arranged obliquely are called a via group 62. The vias 61 of both ends of the via group 62 are arranged to be closer to the outside than an edge of the radio frequency transmission line 42. The via group 62 is arranged at a predetermined interval P4 in the X direction.

The vias 61 are connected commonly to an extraction wiring line 63. The extraction wiring line 63 is connected to a power supply 46 through a resistor 45. The power supply 46 applies a positive voltage to the vias 61.

An interlayer insulating film 64 is provided on the silicon oxide film 32 to cover the extraction wiring line 63. The radio frequency transmission line 42 is provided on the interlayer insulating film 64.

The bias line 12 has a plurality of via groups 62. The bias line 12 is provided below the radio frequency transmission line 42 and above a silicon substrate 31.

In the embodiment, a distance (T1-T2) between a bottom surface of the via 61 and an interface of the silicon oxide film 32 and the silicon substrate 31 is smaller than the distance (T1) between the bottom surface of the wiring line 43 shown in FIGS. 4A and 4B and the interface of the silicon oxide film 32 and the silicon substrate 31. The bottom surface of the via 61 is closer to the interface of the silicon oxide film 32 and the silicon substrate 31 than the bottom surface of the wiring line 43.

Therefore, the via 61 has the ability of drawing charges per unit area, which is superior to the ability of the wiring line 43. The via 61 can draw a large amount of charges per unit area, as compared with the wiring line 43.

A method of forming the via 61 will be described. FIGS. 9A to 9D are cross-sectional views sequentially showing steps of forming the via 61.

Figure 9A:
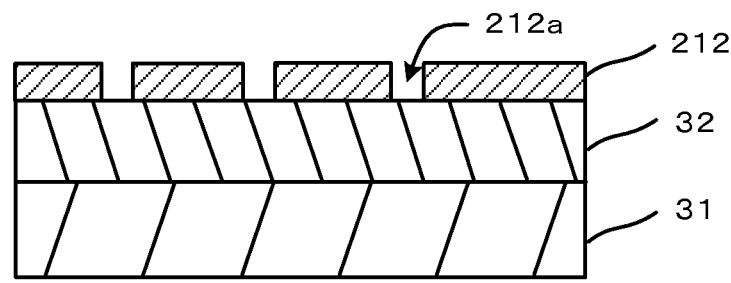
FIGS. 9A to 9D are cross-sectional views sequentially showing steps of forming the main portion of the semiconductor switch circuit according to the second embodiment.

As shown in FIG. 9A, a resist film 212 having an opening 212a corresponding to the via 61 is formed on the silicon oxide film 32 exposed by removing the silicon layer 33, by a photolithography method.

Figure 9B:
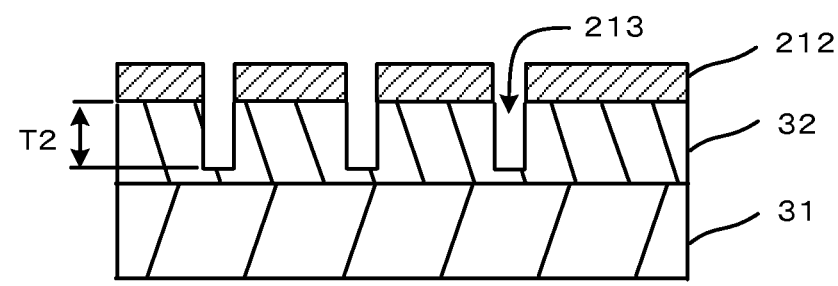

As shown in FIG. 9B, the silicon oxide film 32 is etched using the resist film 212 as a mask by an RIE method using a gas of fluorine system to form a trench 213 having a depth of T2. The depth T2 is controlled by managing an etching time.

Figure 9C:
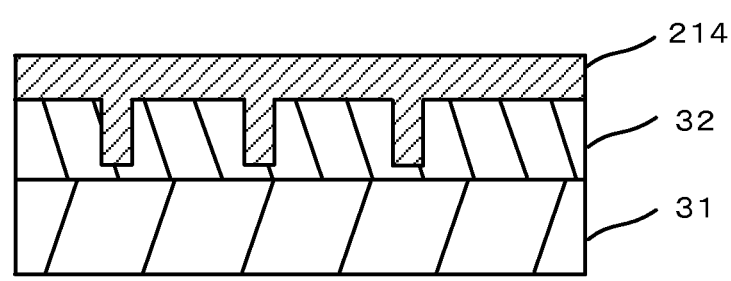

As shown in FIG. 9C, a polysilicon film 214 to which impurities are doped is formed on the silicon oxide film 32 to fill the trench 213 with the polysilicon film, by a CVD method, after the resist film 212 is removed.

Figure 9D:
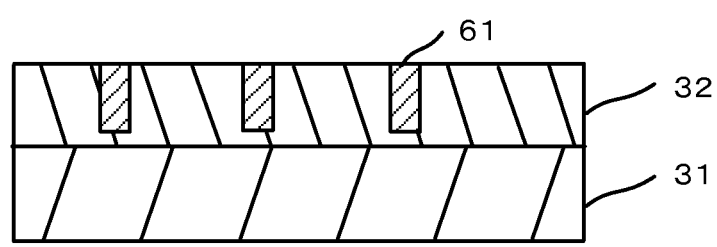

As shown in FIG. 9D, the polysilicon film 214 is removed by a chemical mechanical polishing (CMP) method, until the silicon oxide film 32 is exposed. The remaining portion of the polysilicon film 214 becomes the via 61.

As described above, in the semiconductor switch circuit of the embodiment, the bias line 12 has the vias 61 reaching from the side of the silicon layer 33 to the inner portion of the silicon oxide film 32.

Therefore, because the bottom surface of the via 61 is close to the interface of the silicon oxide film 32 and the silicon substrate 31, the via 61 can draw a large amount of charges per unit area. As a result, harmonic distortion is further decreased. In addition, power loss of the radio frequency transmission line 42 can be decreased.

When a negative voltage is applied to the silicon substrate 31, the via 61 may be connected to a ground.

Third Embodiment

Figure 10A:
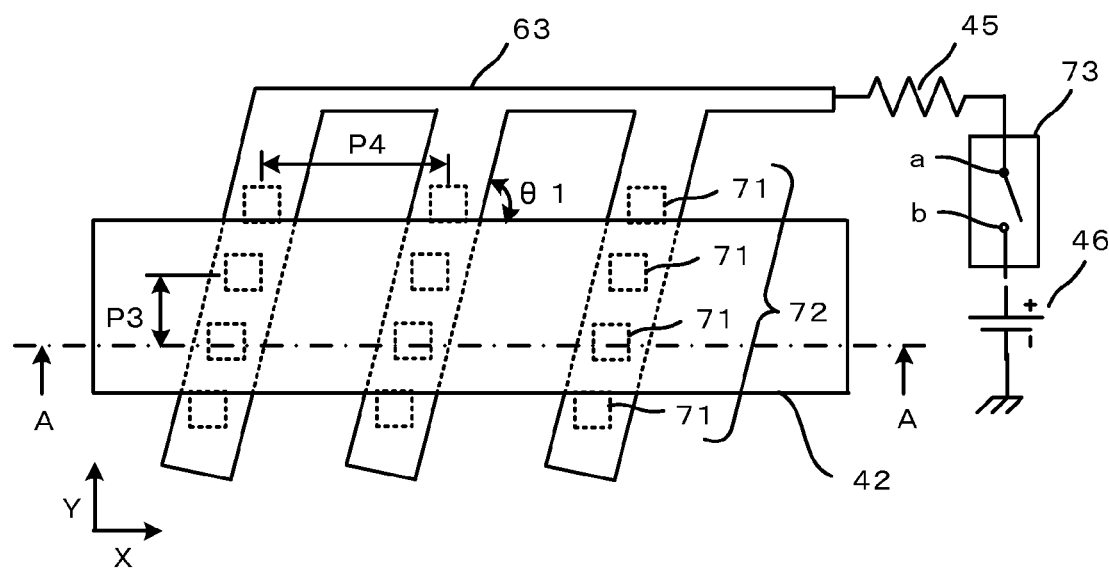
FIGS. 10A and 10B are diagrams showing a main portion of a semiconductor switch circuit according to a third embodiment.
Figure 10B:
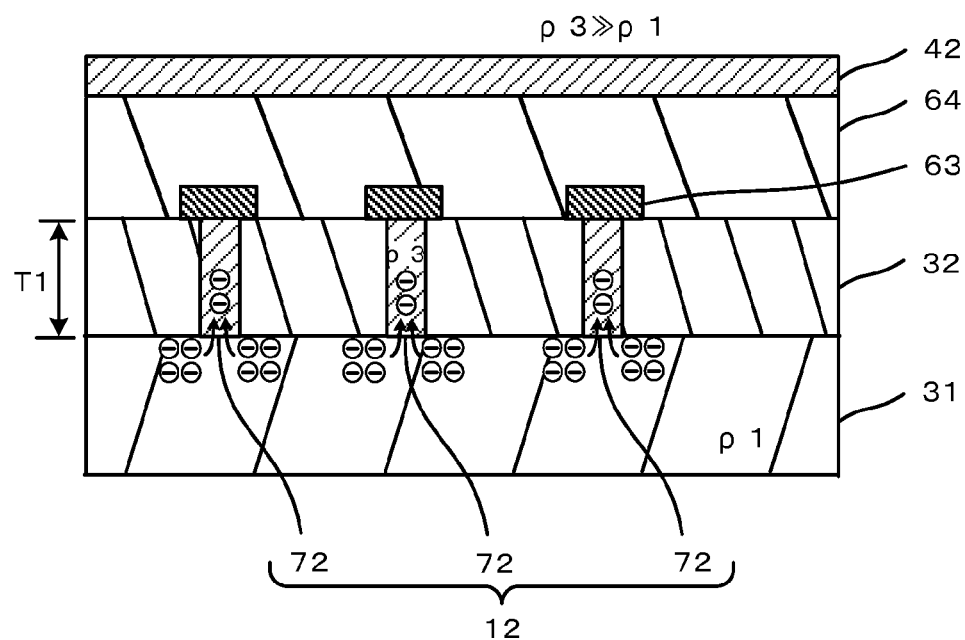

A semiconductor switch circuit in accordance with a third embodiment will be described with reference to FIGS. 10A and 10B. FIGS. 10A and 10B are diagrams showing a bias line of the semiconductor switch circuit of the embodiment. FIG. 10A is a plan view of the bias line and FIG. 10B is a cross-sectional view taken along the line A-A of FIG. 10A and viewed in a direction of arrow.

In the embodiment, the same components as those of the first embodiment are denoted with the same reference numerals, the description of the same components is omitted, and only different components are described. The embodiment is different from the first embodiment in that a plurality of columnar objects penetrating a silicon oxide film is provided.

As shown in FIGS. 10A and 10B, a plurality of vias (columnar objects) 71 penetrating a silicon oxide film 32 to contact a silicon substrate 31 is provided in the semiconductor switch circuit of the embodiment. The via 71 has third specific resistance $\rho3$ higher than first specific resistance $\rho1$ of the silicon substrate 31. The third specific resistance $\rho3$ is about $1 \times 10^6$ $\Omega \cdot cm$ to $1 \times 10^9$ $\Omega \cdot cm$, for example.

The via 71 is a polysilicon film to which both a large amount of donor impurities and a large amount of acceptor impurities are doped, for example. When a donor impurity concentration and an acceptor impurity concentration are substantially equalized to each other, the donors and the acceptors compensate for each other and polysilicon having the high third specific resistance $\rho3$ is obtained (impurity compensation effect).

The vias 71 are arranged obliquely at a predetermined angle $\theta1$ with respect to an X direction in which a radio frequency transmission line 42 extends in plan view. The vias 71 are arranged at a predetermined interval P3 in a Y direction. A group of vias 71 arranged obliquely are called a via group 72. The vias 71 of both ends of the via group 72 are arranged to be closer to the outside than an edge of the radio frequency transmission line 42. The via group 72 is arranged at a predetermined interval P4 in the X direction.

The vias 71 are connected commonly to an extraction wiring line 63. The extraction wiring line 63 is connected to a terminal a of a single-pole single-through switch 73 through a resistor 45. A terminal b of the switch 73 is connected to a power supply 46.

In the embodiment, because the via 71 is in contact with the silicon substrate 31, the silicon oxide film 32 does not exist below the via 71. Therefore, because the interface of the silicon oxide film 32 and the silicon substrate 31 does not exist, charges accumulated in the vicinity of the interface also do not exist. As a result, a total amount of charges accumulated in the vicinity of the interface can be decreased.

The polysilicon includes a lot of crystal defects. Therefore, the probability that the charges passing through the lower side of the via 71 are trapped in the crystal defects is increased. As a result, a total amount of charges accumulated in the vicinity of the interface can be further decreased.

Even though the switch 73 is closed, that is, the terminals a, b are connected and a positive voltage is applied to the via 71, the via 71 has the high third resistance. For this reason, a current rarely passes through the via 71. Therefore, the via 71 can be biased positively to the silicon substrate 31. As a result, the via 71 can draw the surrounding charges and restrict free movement of the charges.

Steps of forming the via 71 are the same as the steps of forming the via 61, shown in FIGS. 9A to 9D, and the description of the steps is omitted. Because a lower end of the via 71 may be embedded in the silicon substrate 31, formation of the trench by the RIE method becomes easy.

As described above, the vias 71 that penetrate the silicon oxide film 32 to contact the silicon substrate 31, and have the third specific resistance higher than the first specific resistance are provided in the semiconductor switch circuit of the embodiment.

Because the via 71 traps the charges in the vicinity of the interface, the total amount of charges can be decreased. In addition, the positively biased via 71 can draw the charges.

As a result, harmonic distortion is further decreased, and power loss of the radio frequency transmission line 42 can be decreased.

When a negative voltage is applied to the silicon substrate 31, the via 61 may be connected to a ground.

Fourth Embodiment

Figure 11:
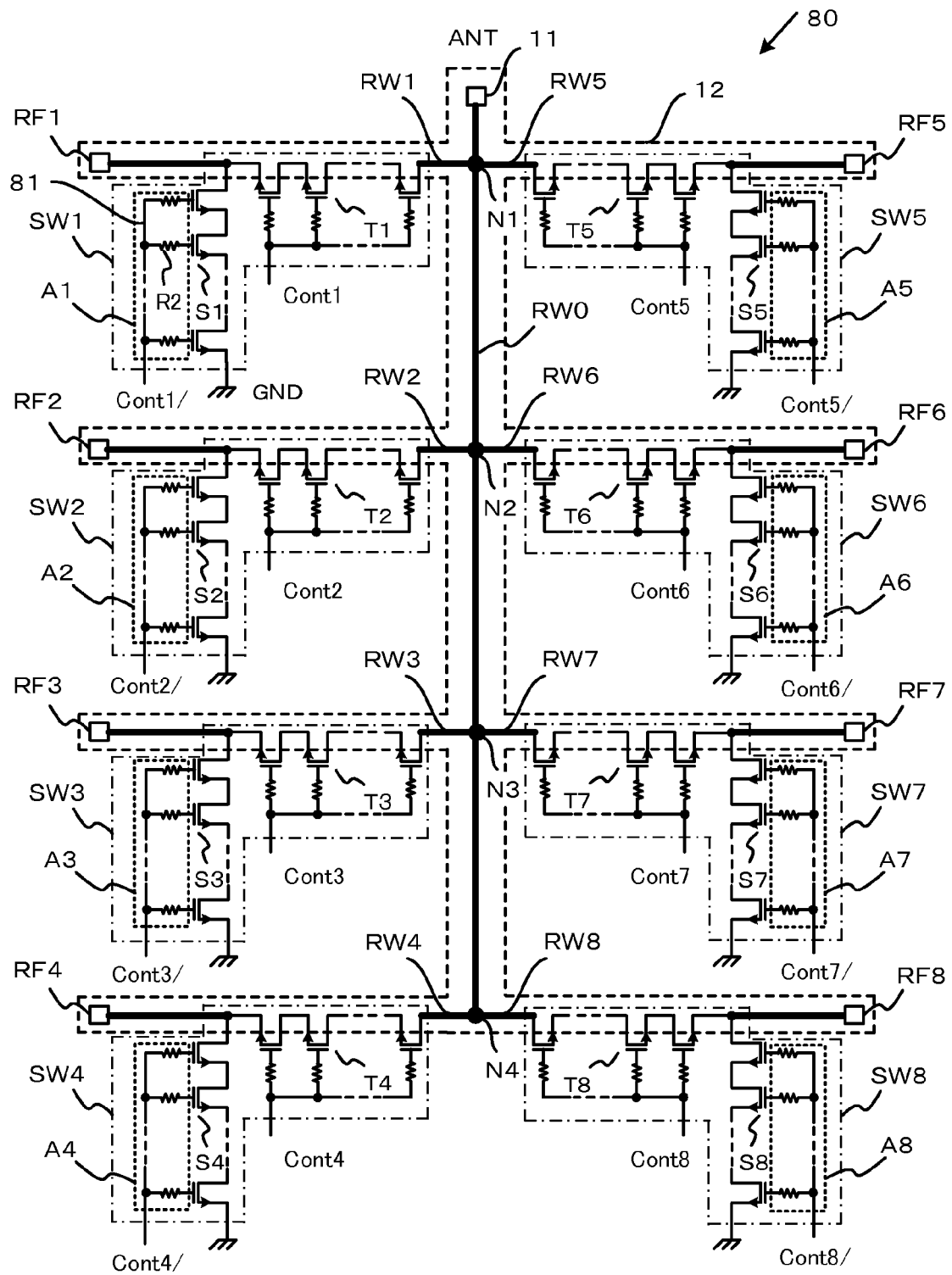
FIG. 11 is a circuit diagram showing a semiconductor switch circuit according to a fourth embodiment.
Figure 12:
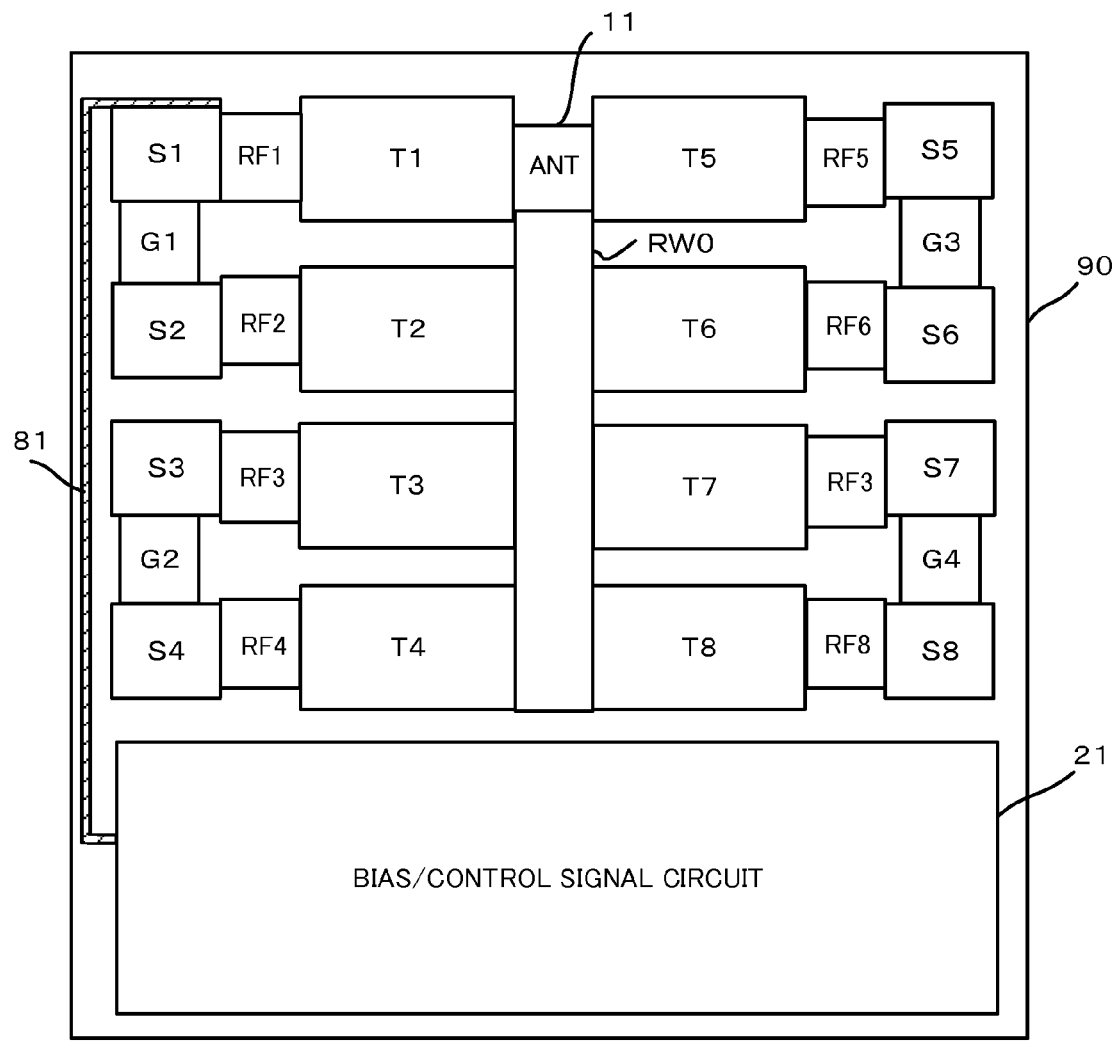
FIG. 12 is a plan view showing a semiconductor chip provided with the semiconductor switch circuit according to the fourth embodiment.
Figure 13:
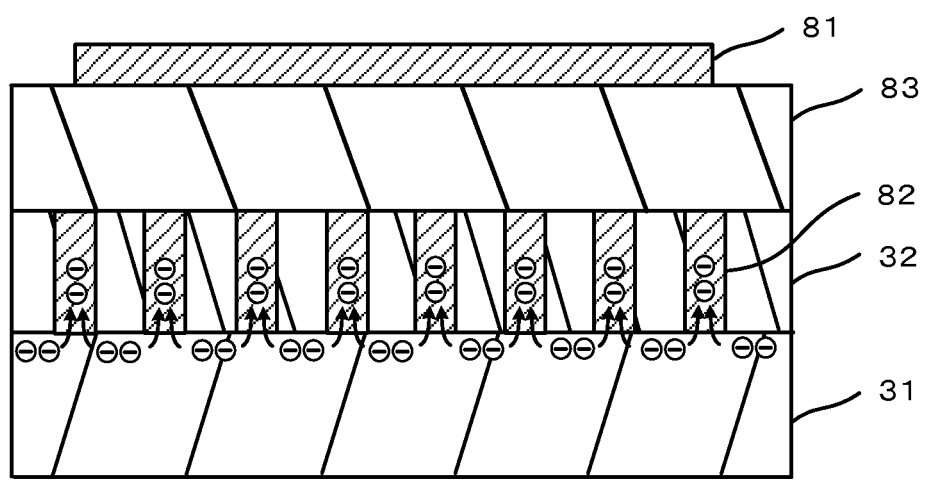
FIG. 13 is a cross-sectional view showing the main portion of the semiconductor switch circuit according to the fourth embodiment.
Figure 14:
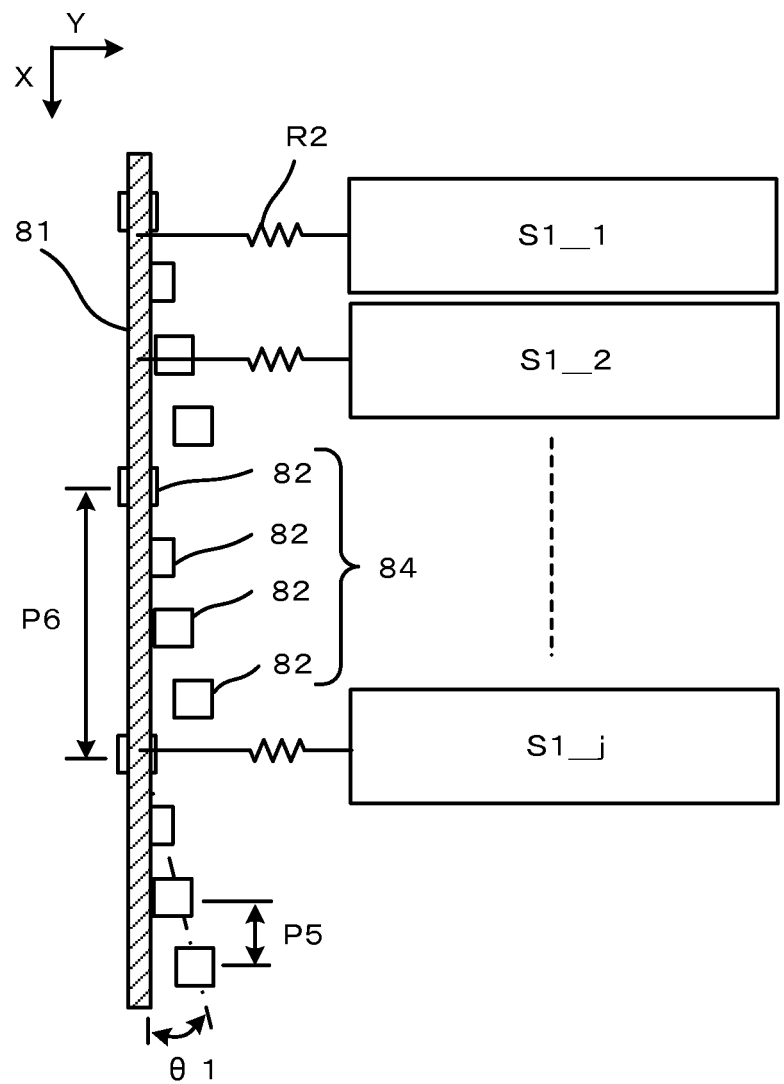
FIG. 14 is a plan view showing the main portion of the semiconductor switch circuit according to the fourth embodiment.

A semiconductor switch circuit in accordance with a fourth embodiment will be described with reference to FIGS. 11 to 14. FIG. 11 is a circuit diagram showing a semiconductor switch circuit of the embodiment, FIG. 12 is a plan view showing a semiconductor chip provided with the semiconductor switch circuit, FIG. 13 is a cross-sectional view showing a via provided below a DC bias wiring line of the semiconductor switch circuit, and FIG. 14 is a plan view showing the via provided below the DC bias wiring line of the semiconductor switch circuit.

In the embodiment, the same components as those of the first embodiment are denoted with the same reference numerals, the description of the same components is omitted, and only different components are described. The embodiment is different from the first embodiment in that a plurality of columnar objects is provided below the DC bias wiring line.

As shown in FIGS. 11 to 14, in a semiconductor switch circuit 80 according to the embodiment, a plurality of vias (second conductors) 82 is provided below a DC bias wiring line (second wiring line) 81 connected to a gate terminal of a shunt transistor S1.

The above description is applicable to shunt transistors S2 to S8. Each of regions A1 to A8 surrounded by broken lines shows a region in which the via 82 is provided. Hereinafter, the region A1 will be described. However, the description is applicable to the other regions A2 to A8.

In the region A1, a resistor R2 and a DC bias wiring line 81 are provided. The resistor R2 is connected to a gate terminal of the shunt transistor S1 to prevent radio frequency signal leakage. The DC bias wiring line 81 connects the resistor R2 to a gate terminal and an inversion control signal Cont1/output terminal of a bias/control signal circuit 21.

As shown in FIG. 12, a semiconductor switch circuit 80 is provided in a semiconductor chip 90. The DC bias wiring line 81 is arranged along the outer circumference of the semiconductor chip 90 so as to reach from the region in which the shunt transistor S1 is provided to the inversion control signal Cont1/output terminal of the bias/control signal circuit 21.

As shown in FIG. 13, the via 82 penetrates the silicon oxide film 32 exposed by removing the silicon layer 33 to contact the silicon substrate 31. An interlayer insulating film 83 is provided on the silicon oxide film 32 and the top surface of the via 82. The DC bias wiring line 81 is provided on the interlayer insulating film 83. The via 82 is not provided right below the shunt transistor S1.

As shown in FIG. 14, the vias 82 are arranged obliquely at a predetermined angle $\theta1$ with respect to an X direction in which a DC bias wiring line 81 extends in plan view. The vias 82 are arranged at a predetermined interval P5 in the X direction.

A group of vias 82 arranged obliquely are called a via group 84. The vias 82 of both ends of the via group 84 are arranged to be closer to the outside than an edge of the DC bias wiring line 81. The via groups 84 are arranged at a predetermined interval P6 in the X direction.

In the semiconductor switch circuit 80 of the embodiment, the vias 82 penetrating the silicon oxide film 32 to contact the silicon substrate 31 are provided below the DC bias wiring line 81 connected to the gate terminal of the shunt transistor S1.

Therefore, because the interface of the silicon oxide film 32 and the silicon substrate does not exist below the via 82, an area of the interface decreases and a charge amount of the interface decreases. In addition, the interface is discontinuous, so that movement of the charges of the interface is suppressed.

The polysilicon includes a lot of crystal defects. Therefore, the probability that the crystal defects trap the charges passing through the lower side of the via 82 is increased. As a result, a total amount of charges accumulated in the vicinity of the interface can be further decreased.

As a result, harmonic distortion generated in the DC bias wiring line 81 can be decreased. In addition, because the movement of the charges of the interface is suppressed, loss of the wiring line which the radio frequency signal passes through can be decreased.

As described above, in the semiconductor switch circuit 80 of the embodiment, the vias 82 penetrating the silicon oxide film 32 to contact the silicon substrate 31 are provided below the DC bias wiring line 81.

Therefore, because an area of the interface of the silicon oxide film 32 and the silicon substrate 31 decreases, a charge amount of the interface decreases. Because the interface is discontinuous, the movement of the charges of the interface is suppressed. As a result, harmonic distortion generated in the DC bias wiring line 81 is decreased. In addition, power loss of the radio frequency transmission line 42 can be decreased.

In the embodiment, the case in which the via 82 is provided below the DC bias wiring line 81 of the shunt transistor S1 has been described. However, the via 82 can be provided below the DC bias wiring line of the through transistor T1. The harmonic distortion generated in the DC bias wiring line of the through transistor T1 is decreased.

In addition, the vias 82 can be provided in both the shunt transistor S1 and the through transistor T1. A reduction effect of the harmonic distortion generated in the DC bias wiring line can be obtained.

Similar to the through transistor T1, in the through transistors T2 to T8, the via 82 can be provided below the DC bias wiring line. The vias 82 can be provided in both sides of each of the shunt transistors S2 to S8 and each of the through transistors T2 to T8.

Figure 15:
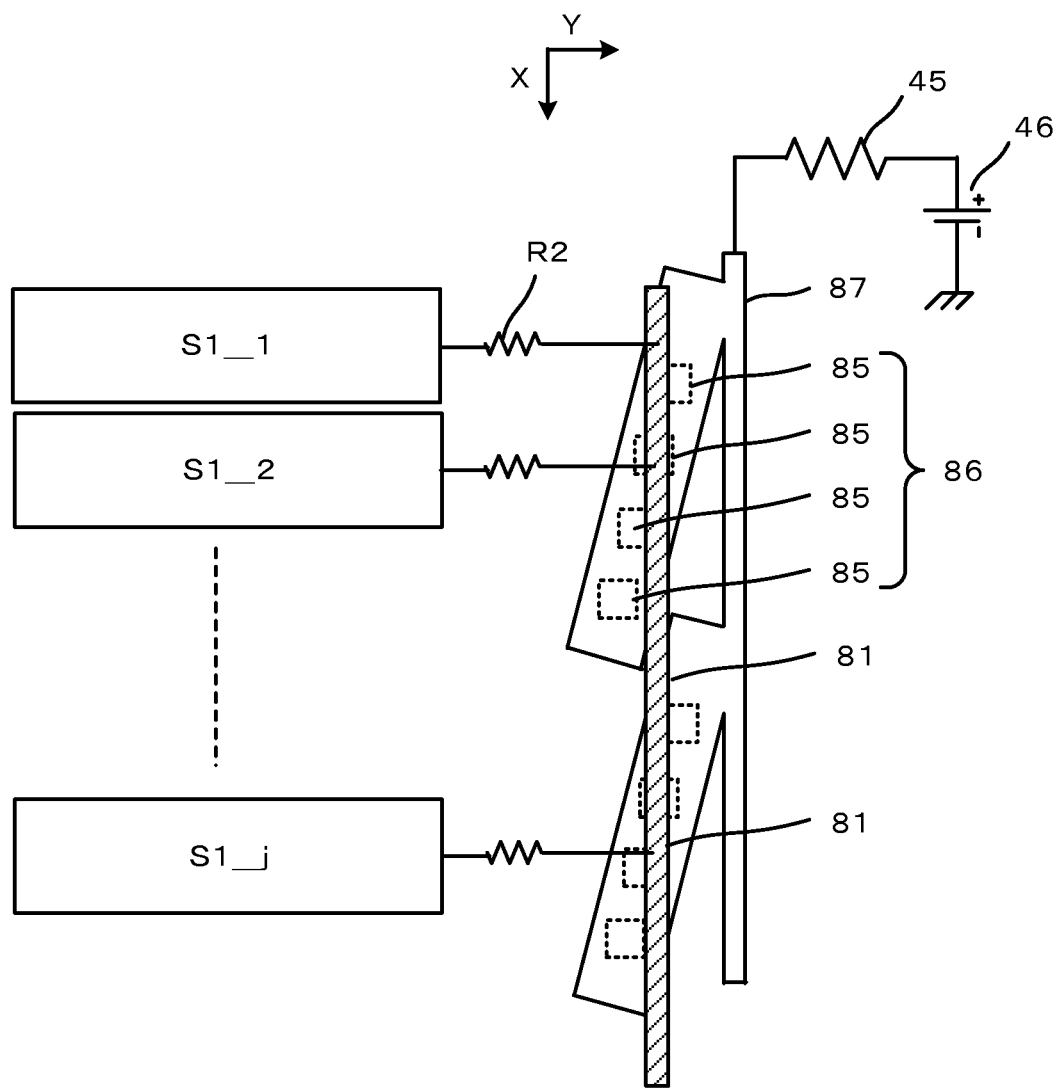
FIG. 15 is a plan view showing another main portion of the semiconductor switch circuit according to the fourth embodiment.

The vias 82 can be configured as vias biased positively to the silicon substrate 31. In this case, the vias 82 are configured as the same vias as the vias 71 shown in FIGS. 10A and 10B. FIG. 15 is a plan view showing a semiconductor switch circuit having vias biased positively to the silicon substrate 31.

As shown in FIG. 15, a plurality of vias (second conductors) 85 is the same vias as the vias 71 shown in FIGS. 10A and 10B. A group of vias 85 arranged obliquely are called a via group 86. The vias 85 are connected commonly to an extraction wiring line 87. The extraction wiring line 87 is connected to a power supply 46 through a resistor 45. The power supply 46 applies a positive voltage to the vias 85.

The positively biased vias 85 draw the charges of the interface. As a result, harmonic distortion is further decreased. When a negative voltage is applied to the silicon substrate 31, the vias 85 may be connected to a ground. The vias 85 can be configured as the vias 61 that do not penetrate the silicon oxide film 32, shown in FIGS. 6A and 6B.

Instead of the vias 85, the same bias line (second conductor) as the bias line 12 shown in FIGS. 4A and 4B or FIGS. 6A and 6B may be provided below the DC bias wiring line 81.

Fifth Embodiment

Figure 16:
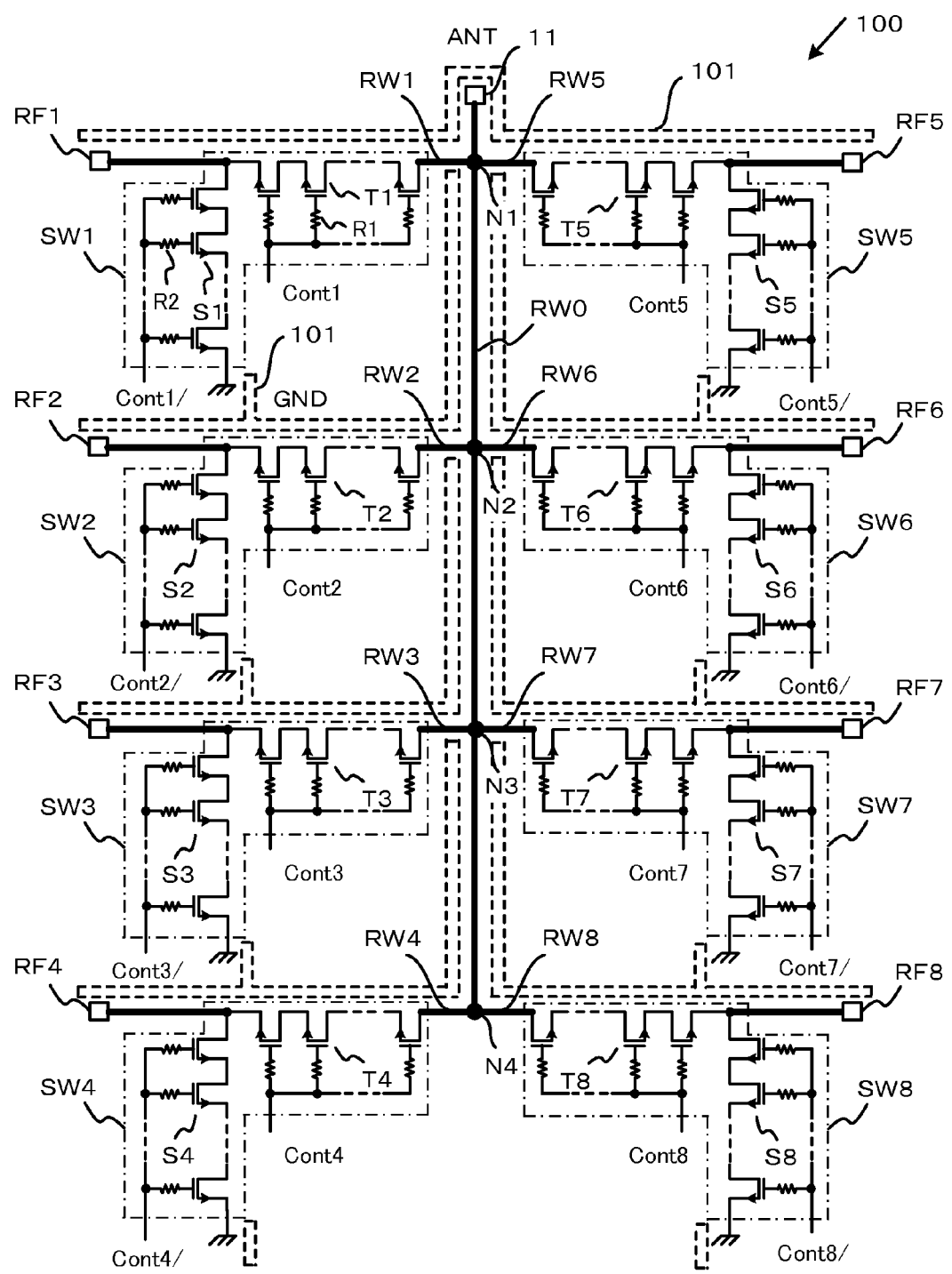
FIG. 16 is a circuit diagram showing a semiconductor switch circuit according to a fifth embodiment.
Figure 17:
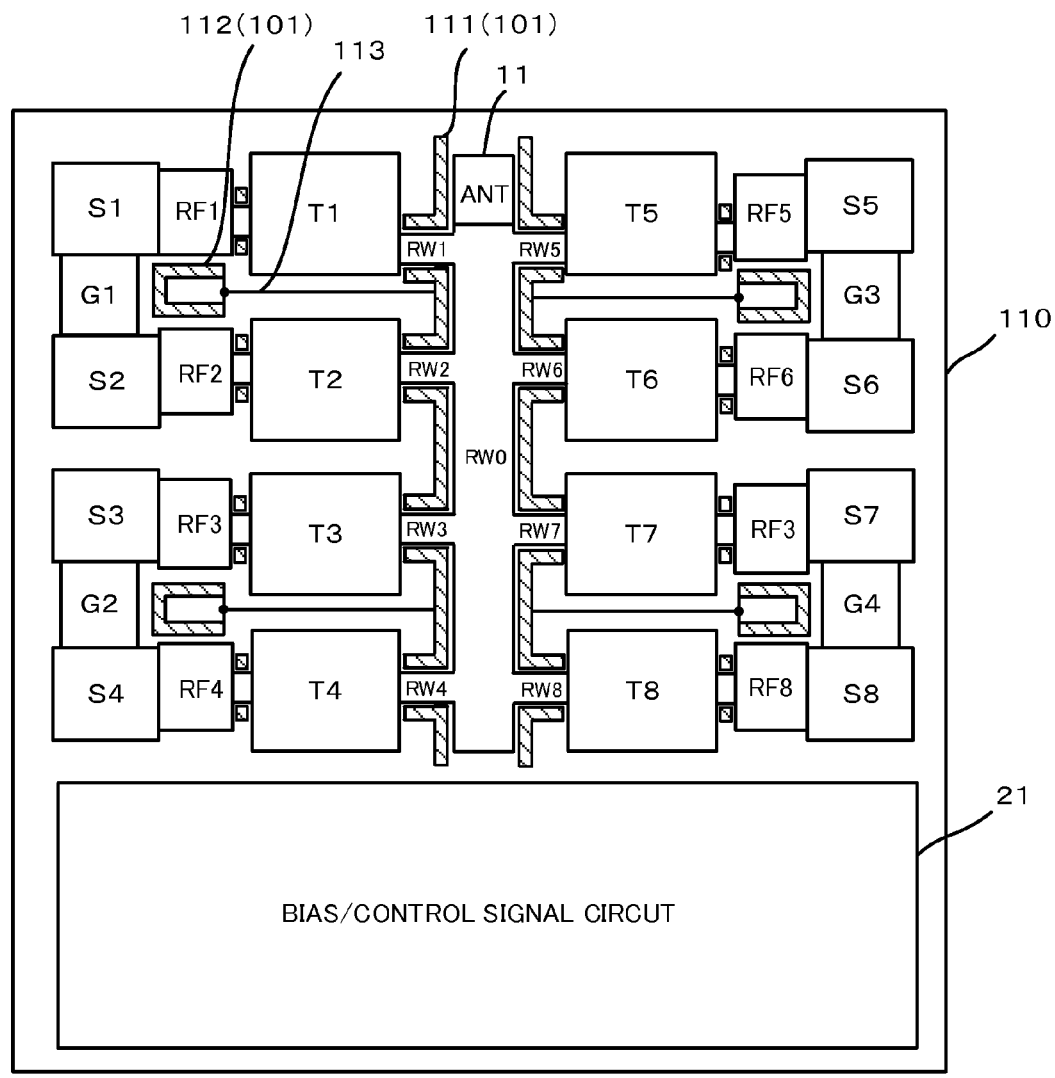
FIG. 17 is a plan view showing a semiconductor chip provided with the semiconductor switch circuit according to the fifth embodiment.
Figure 18A:
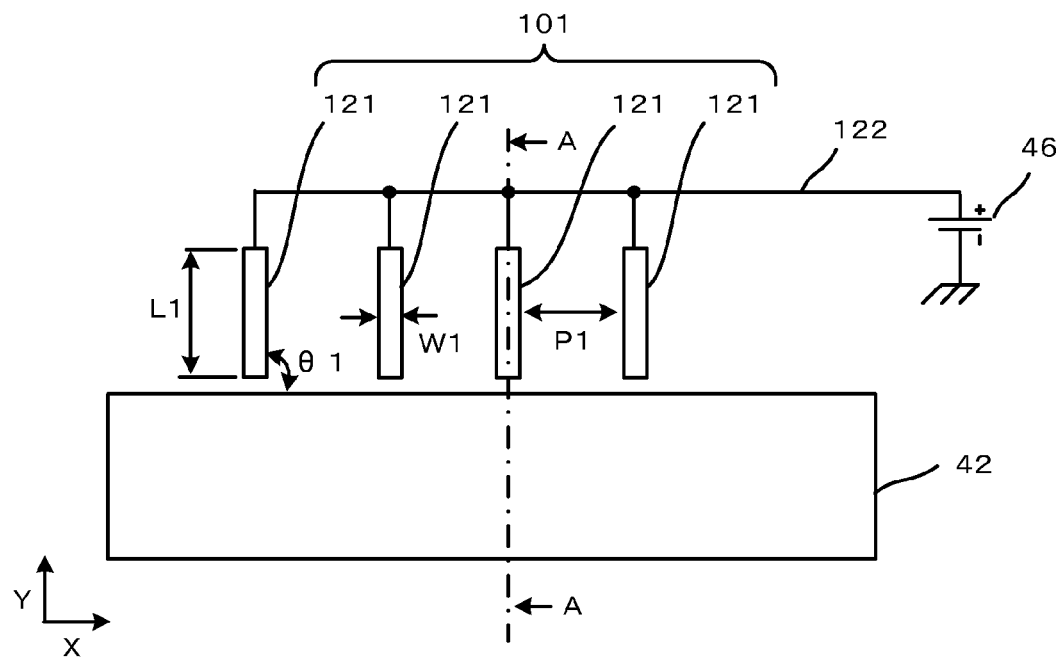
FIGS. 18A and 18B are diagrams showing a main portion of the semiconductor switch circuit according to the fifth embodiment.
Figure 18B:
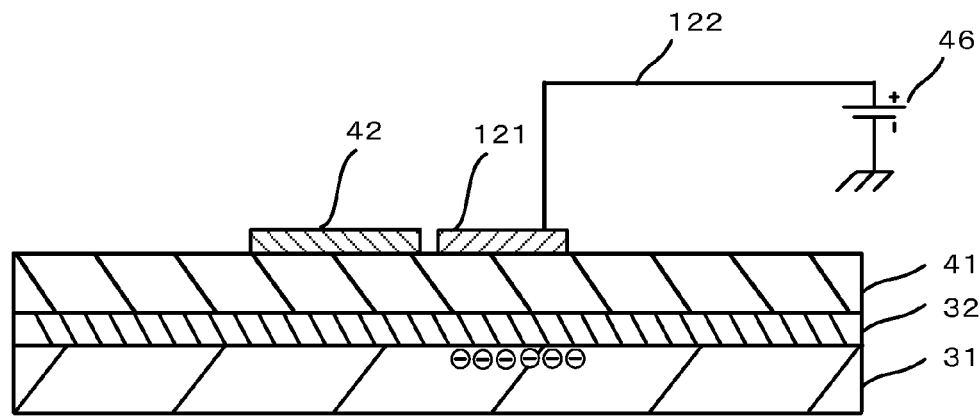

A semiconductor switch circuit in accordance with a fifth embodiment will be described with reference to FIGS. 16 to 18B. FIG. 16 is a circuit diagram showing the semiconductor switch circuit of the embodiment, FIG. 17 is a plan view showing a semiconductor chip provided with the semiconductor switch circuit, and FIGS. 18A and 18B are diagrams showing a bias line of the semiconductor switch circuit. FIG. 18A is a plan view of the bias line and FIG. 18B is a cross-sectional view taken along the line A-A of FIG. 18A and viewed in a direction of arrow.

In the embodiment, the same components as those of the first embodiment are denoted with the same reference numerals, the description of the same components is omitted, and only different components are described. The embodiment is different from the first embodiment in that the bias line is provided not to overlap a radio frequency transmission line in plan view.

As shown in FIG. 16, in a semiconductor switch circuit 100 of the embodiment, a bias line 101 is provided in a region surrounded by a broken line. The bias line 101 is provided laterally to radio frequency transmission lines RW0 to RW8. The bias line 101 is provided laterally to both sides of the radio frequency transmission line RW0. The bias line 101 is also provided laterally to pads of radio frequency terminals RF1 to RF8 and a pad of a ground terminal GND.

As shown in FIG. 17, in the semiconductor chip 110, the bias line 101 is provided in each of a first region 111 along the radio frequency transmission lines RW0 to RW8 and a second region 112 along the pads of the radio frequency terminals RF1, RF2 and the pad of the ground terminal G1. The first region 111 and the second region 112 have a U shape, for example. The bias line 101 provided in the first region 111 and the bias line 101 provided in the second region 112 are electrically connected to each other by the wiring line 113. The second region 112 is provided equally along the pads of the remaining radio frequency terminals and the pad of the ground terminal and thus the description is omitted.

As shown in FIGS. 18A and 18B, an interlayer insulating film 41 is provided on the silicon oxide film 32 exposed by removing a portion of the silicon layer 33. The bias line 101 is provided laterally to the radio frequency transmission line 42, on the interlayer insulating film 41. An extension direction of the radio frequency transmission line 42 is set as an X direction and a direction orthogonal to the X direction is set as a Y direction.

The bias line 101 is provided on the same plane as the radio frequency transmission line 42 and has certain spacing from the radio frequency transmission line 42. In addition, FIG. 17 merely shows a positional relationship of the lines, and does not show as to a direction of the wirings of the bias line 101 from the radio frequency transmission line 42.

The bias line 101 has a plurality of strip-shaped wiring lines (linear objects) 121 with a length of L1 and a width of W1. The wiring lines 121 are provided having certain spacing from the radio frequency transmission line 42 and extend in a direction having a predetermined angle $\theta1$ ($0°<=\theta1<=90°$) with respect to the X direction, in this case, a Y direction ($\theta1=90°$), at positions closer to the outside than an edge of the radio frequency transmission line 42. The wiring lines 121 are arranged at a predetermined interval P1 in the X direction.

One end of each of the wiring lines 121 is connected commonly to the extraction wiring line 122 and the other end of each wiring line 121 is opened. The extraction wiring line 122 is connected to the power supply 46. The power supply 46 applies a positive voltage to the wiring line 121.

Figure 19:
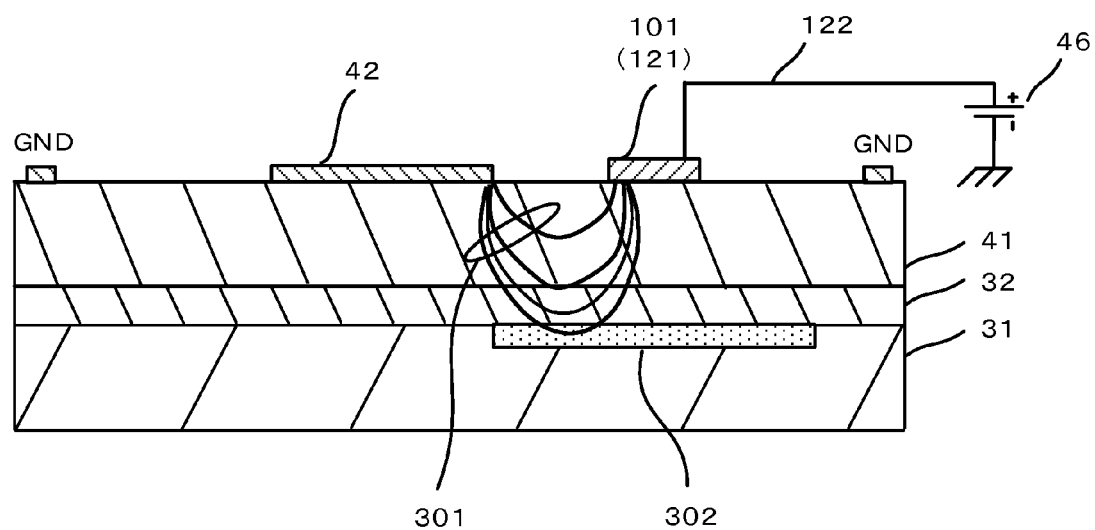
FIG. 19 is a diagram showing an electric flux line of the semiconductor switch circuit according to the fifth embodiment.

FIG. 19 is a diagram showing electric flux lines generated due to the radio frequency signal. As shown FIG. 19, in the embodiment, since impedance of the power supply 46 in the radio frequency band is low enough, it can be assumed that the bias line 101 has low impedance in terms of radio frequency. As a result, electric flux lines 301 are generated between the radio frequency transmission line 42 and the bias line 101 due to the radio frequency signal. A short distance between the radio frequency transmission line 42 and the bias line 101 enables the electric flux lines 301 to concentrate therebetween, so that the electric flux lines 301 include many components which are parallel to the interface.

Since the bias line 101 is biased positively to the silicon substrate 31, the bias line 101 draws the charges of the interface of the silicon oxide film 32 and the silicon substrate 31 due to the Coulomb force.

Therefore, since an area in which the many electric flux lines 301 exist and an area in which the charges 302 suppressed from moving by the bias line 101 exist are overlapped, a probability of movement of the charges not suppressed necessarily from moving by the bias line 101 along the electric flux lines 301 is reduced. A harmonic distortion due to the movement of the charges of the interface can be reduced.

Accordingly, a probability of movement of the charges not suppressed necessarily from moving by the bias line 101 along the electric flux lines is raised, so that a harmonic distortion due to the movement of the charges of the interface can be not necessarily reduced.

When the bias line 101 is in a low impedance state, in terms of radio frequency, an effect of suppressing the movement of the charges of the interface becomes high, as compared with when the bias line 101 is in a high impedance state, in terms of radio frequency. The movement of the charges of the interface is suppressed, so that radio frequency loss of the radio frequency transmission line 42 decreases.

The bias line 101 can be formed of the same material as a channel layer of the through transistors T1 to T8 and the shunt transistors S1 to S8 or a gate wiring line material, in addition to the metal film. The length L1, the width W1, and the predetermined interval P1 of the wiring lines 121 may be appropriately determined in a range in which a targeted effect is obtained.

As described above, in the semiconductor switch circuit 100 of the embodiment, the bias line 101 is provided laterally to the radio frequency transmission line 42. The bias line 101 is in a low impedance state, in terms of radio frequency. As a result, because electric flux lines parallel to the interface are concentrated between the radio frequency transmission line 42 and the bias line 101, an effect of suppressing the movement of the charges of the interface can be increased.

Figure 20A:
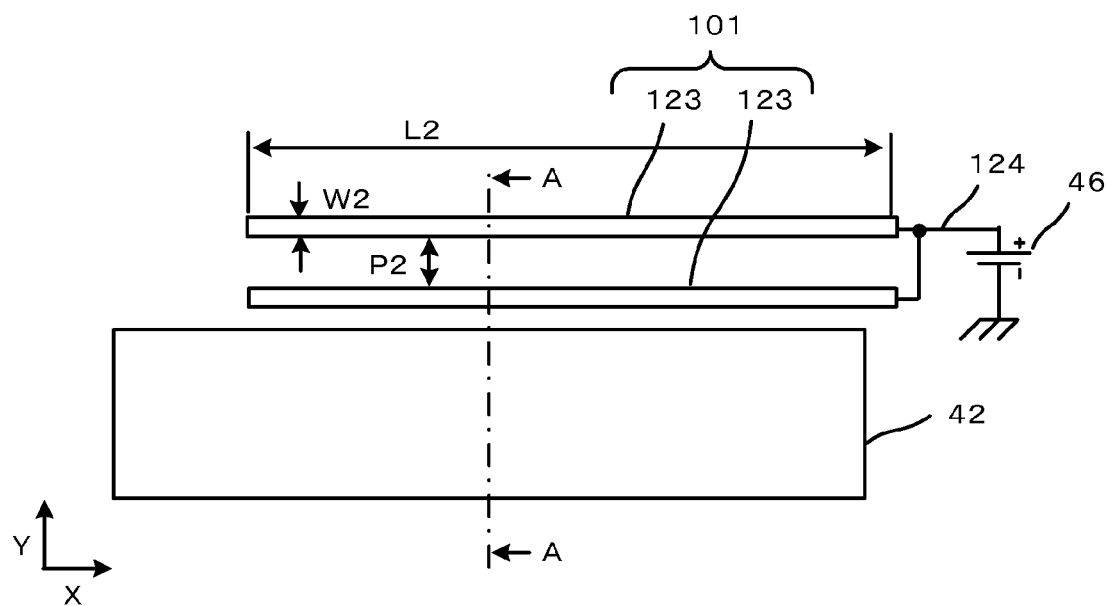
FIGS. 20A and 20B are diagrams showing a modification of the semiconductor switch circuit according to the fifth embodiment.
Figure 20B:
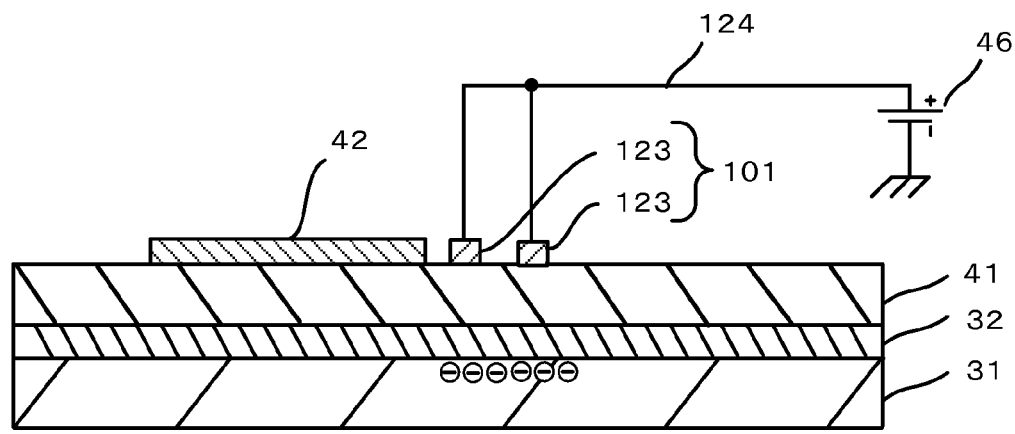

In the embodiment, the case in which the wiring lines of the bias line 101 extend in the Y direction ($\theta 1 = 90°$) has been described. However, the wiring lines may extend in the X direction ($\theta 1 = 0°$). FIGS. 20A and 20B being a modification of the embodiment are diagrams showing a bias line having a plurality of wiring lines extending in the X direction. FIG. 20A is a plan view of the bias line and FIG. 20B is a cross-sectional view taken along the line A-A of FIG. 20A and viewed in a direction of arrow.

As shown in FIGS. 20A and 20B, the bias line 101 has a plurality of wiring lines 123 that extend in the X direction and have a length of L2 and a width of W2. The wiring lines 123 are arranged at a predetermined interval P2 in the Y direction.

One end of the wiring line 123 is connected commonly to the extraction wiring line 124. The other end of the wiring line 123 is opened. The extraction wiring line 124 is connected directly to the power supply 46.

The power supply 46 applies a positive voltage to the wiring lines 123. The charges generated in the interface of the silicon oxide film 32 and the silicon substrate 31 are drawn below the wiring lines 123 and free movement of the charges is restricted.

The length L2, the width W2, and the predetermined interval P2 of the wiring lines 123 may be appropriately determined in a range in which a targeted effect is obtained.

In addition, the bias line 101 shown in FIGS. 18A and 18B and the bias line 101 shown in FIGS. 20A and 20B can be provided laterally to the DC bias wiring line 81 shown in FIG. 12.

Sixth Embodiment

Figure 21A:
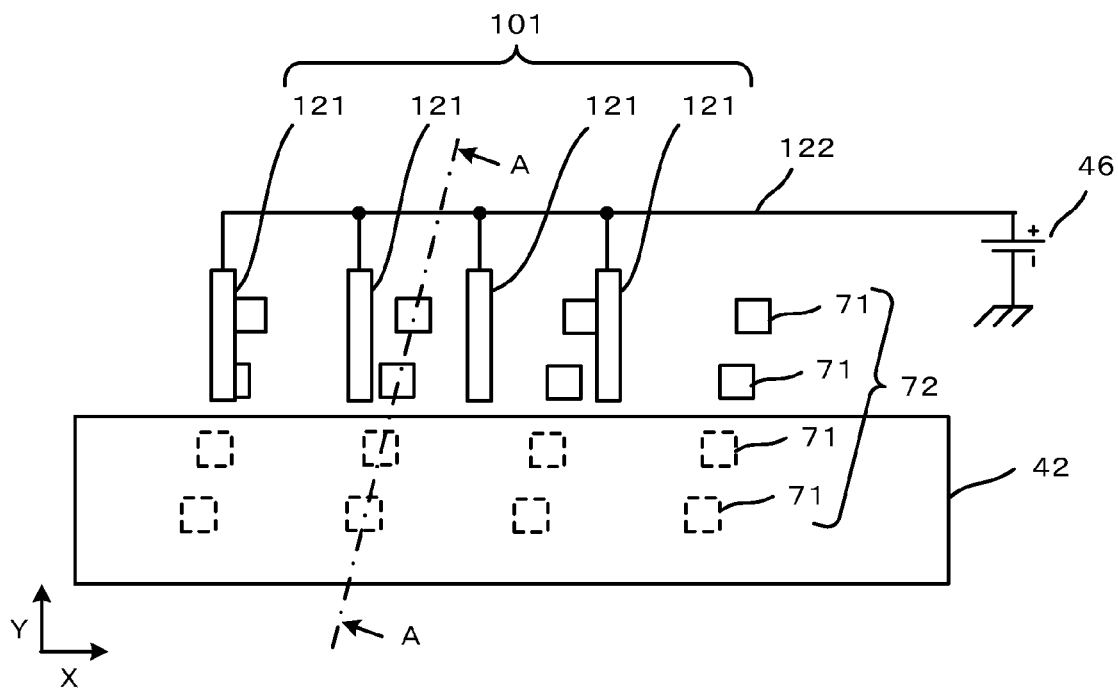
FIGS. 21A and 21B are diagrams showing a main portion of a semiconductor switch circuit according to a sixth embodiment.
Figure 21B:
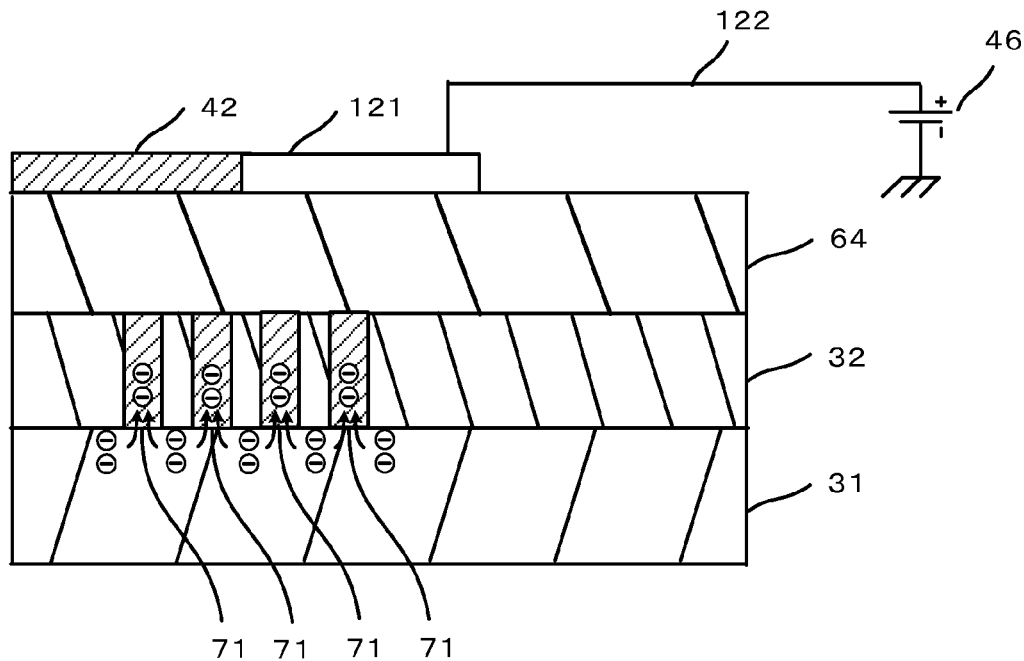

A semiconductor switch circuit in accordance with a sixth embodiment will be described with reference to FIGS. 21A and 21B. FIGS. 21A and 21B are diagrams showing a main portion of the semiconductor switch circuit of the embodiment. FIG. 21A is a plan view of the semiconductor switch circuit and FIG. 21B is a cross-sectional view taken along the line A-A of FIG. 21A and viewed in a direction of arrow.

In the embodiment, the same components as those of the first embodiment are denoted with the same reference numerals, the description of the same components is omitted, and only different components are described. The embodiment is different from the fifth embodiment in that the bias line 101 shown in FIGS. 18A and 18B and the vias 71 (columnar objects) shown in FIGS. 10A and 10B are combined.

As shown in FIGS. 21A and 21B, the semiconductor switch circuit according to the embodiment has the wiring lines 121 that are provided laterally to the radio frequency transmission line 42 and the vias 71 that penetrate the silicon oxide film 32 to contact the silicon substrate 31. The some vias 71 of the via group 72 are arranged below the radio frequency transmission line 42. The remaining vias 71 of the via group 72 are arranged to be closer to the outside than an edge of the radio frequency transmission line 42. The remaining vias 71 of the via group 72 partially overlap the wiring lines 121 in plan view. The wiring lines 121 and the vias 71 may not overlap each other. The wiring line 121 and the vias 71 are not electrically connected to the each other.

The bias line 101 is in a low impedance state, in terms of radio frequency. Electric flux lines are concentrated between the radio frequency transmission line 42 and the bias line 101, so that an effect of suppressing the movement of the charges of the interface becomes high. Because the charges are not generated on the interface of the vias 71 and the silicon substrate 31, a total charge amount of the interface decreases. Because the via 71 trap the charges of the interface, the movement of the charges of the interface is suppressed.

As described above, in the embodiment, a total charge amount of the interface is decreased by a synergy effect of the bias lines 101 and the vias 71 and the movement of the charges of the interface is suppressed. Therefore, the harmonic distortion and the radio frequency loss can be further decreased.

Figure 22A:
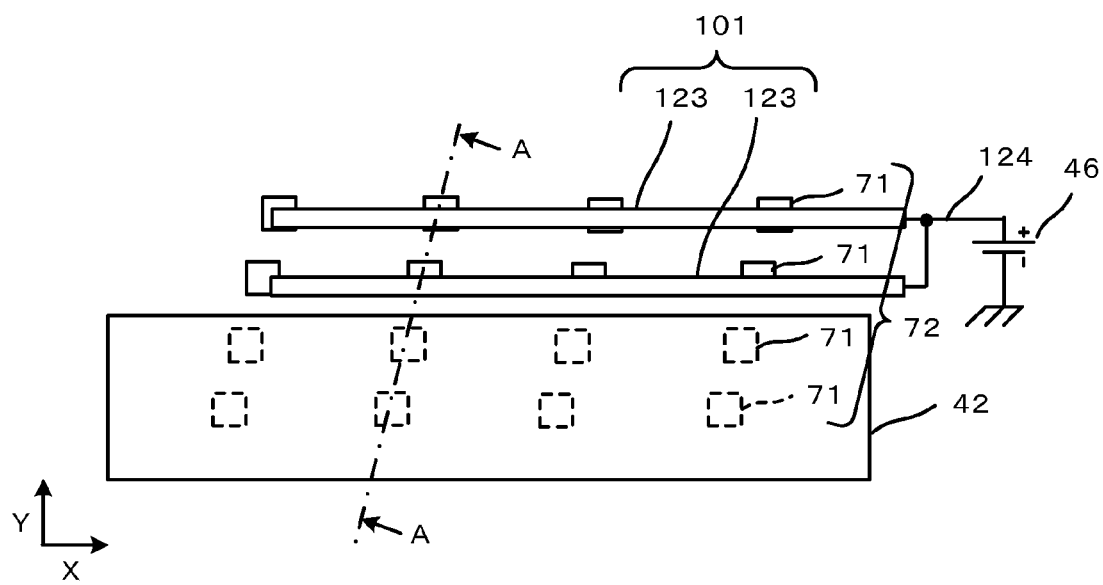
FIGS. 22A and 22B are diagrams showing another main portion of the semiconductor switch circuit according to the sixth embodiment.
Figure 22B:
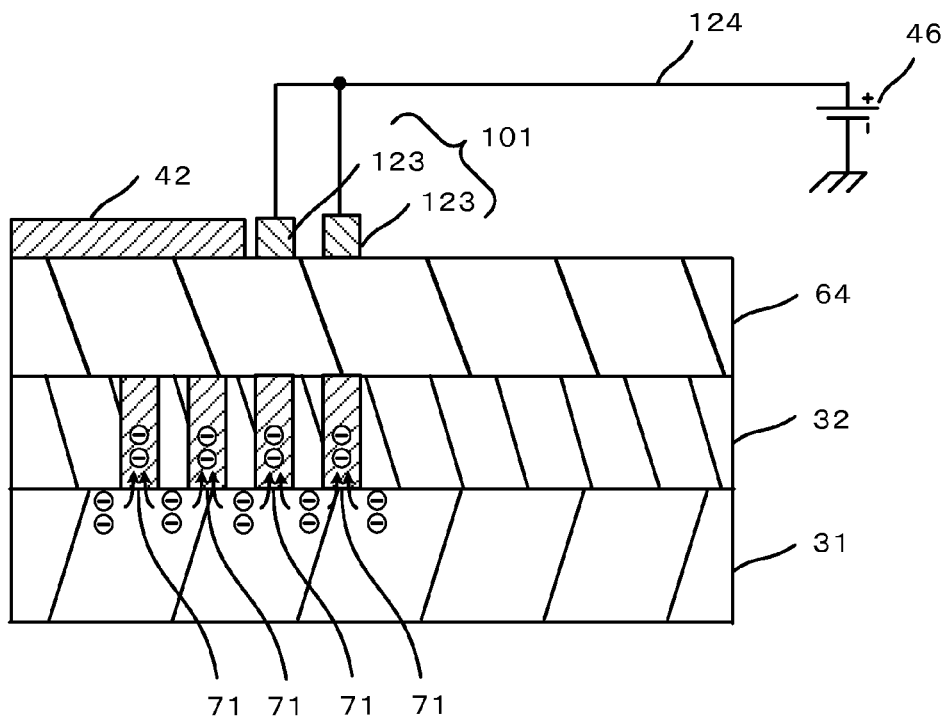

The bias line 101 shown in FIGS. 20A and 120B and the vias 71 shown in FIGS. 10A and 10B may be combined. FIGS. 22A and 22B are diagrams showing the bias line 101 having the wiring lines 123 combined with the vias 71. FIG. 22A is a plan view of the bias line 101 and FIG. 22B is a cross-sectional view taken along the line A-A of FIG. 2A and viewed in a direction of arrow. The remaining vias 71 of the via group 72 partially overlap the wiring lines 123 in plan view.

Seventh Embodiment

A semiconductor switch circuit in accordance with a seventh embodiment will be described with reference to FIGS. 22A and 22B. FIGS. 22A and 22B are diagrams showing a main portion of the semiconductor switch circuit of the embodiment. FIG. 22A is a plan view of the semiconductor switch circuit and FIG. 22B is a cross-sectional view taken along the line A-A of FIG. 22A and viewed in a direction of arrow.

In the embodiment, the same components as those of the first embodiment are denoted with the same reference numerals, the description of the same components is omitted, and only different components are described. The embodiment is different from the sixth embodiment in that bias lines 101 and vias 71 are electrically connected to each other.

Figure 23A:
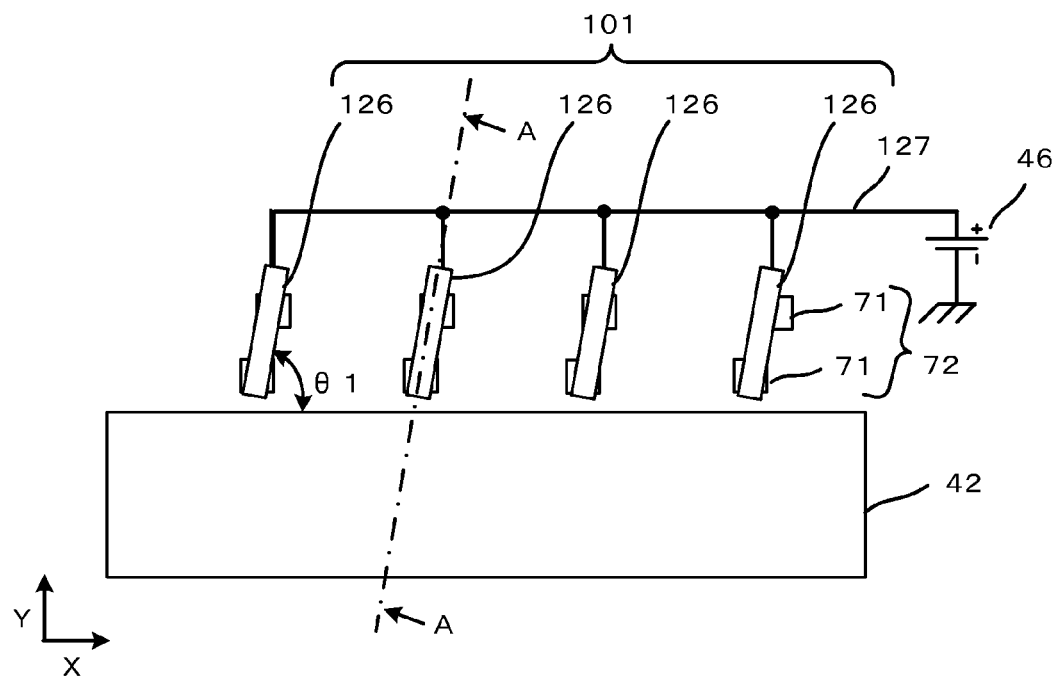
FIGS. 23A and 23B are diagrams showing a main portion of a semiconductor switch circuit according to a seventh embodiment.
Figure 23B:
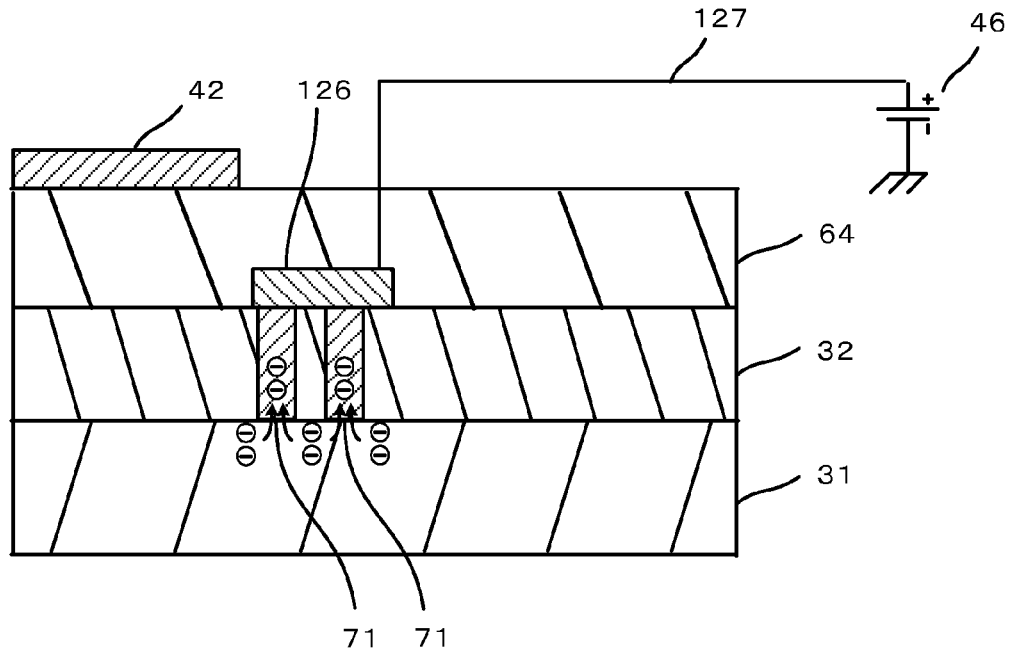

As shown in FIGS. 23A and 23B, in the semiconductor switch circuit of the embodiment, the bias line 101 has a plurality of wiring lines 126 provided on the silicon oxide film 32 and obliquely below the radio frequency transmission line 42. The wiring lines 126 extend at a predetermined angle θ1 (0°<θ1<90°) with respect to a X direction. The radio frequency transmission line 42 and the wiring line 126 do not overlap each other in plan view. The radio frequency transmission line 42 and the wiring line 126 are provided on different planes. The vias 71 that penetrate the silicon oxide film 32 to contact the silicon substrate 31 are provided. The vias 71 are arranged below the wiring lines 126 and are in contact with the wiring lines 126.

One end of each of the wiring lines 126 is connected commonly to the extraction wiring line 127 and the other end of each wiring line is opened. The extraction wiring line 127 is connected directly to the power supply 46. The wiring line 126 and the via 71 are electrically connected to each other. The power supply 46 applies a positive voltage to the wiring line 126 and the via 71.

Because the positive voltage can be applied to the via 71 through the wiring line 126 of the bias line 101, the charges of the interface are drawn to the vias 71 and an effect of suppressing the movement of the charges of the interface can be increased. Therefore, harmonic distortion and radio frequency loss can be greatly decreased.

As described above, in the embodiment, because the positive voltage is applied to both sides of the bias line 101 and the vias 71, the harmonic distortion and the radio frequency loss can be greatly decreased.

Figure 24A:
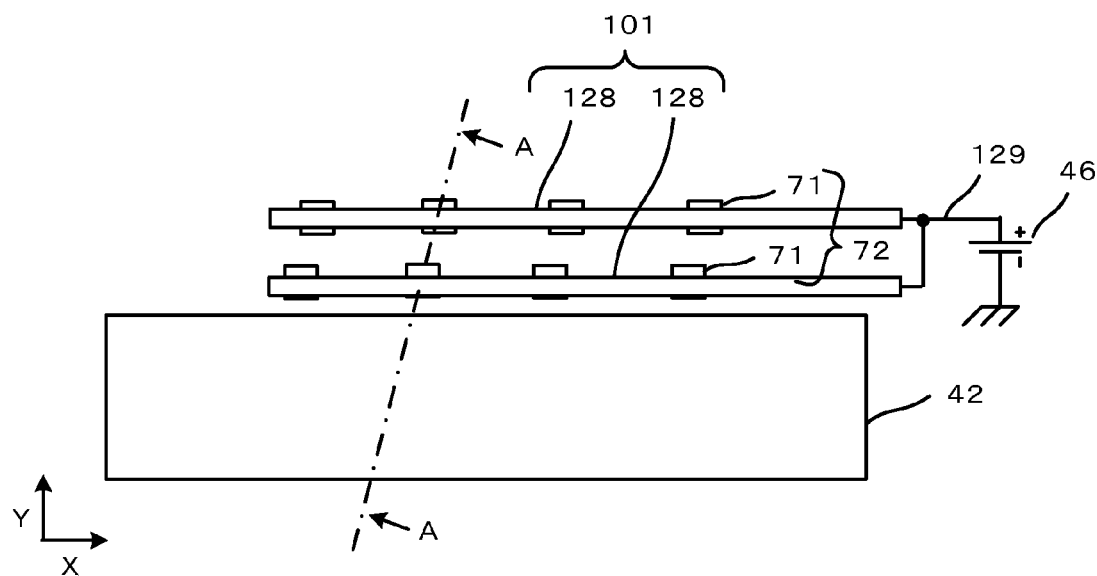
FIGS. 24A and 24B are diagrams showing another main portion of the semiconductor switch circuit according to the seventh embodiment.
Figure 24B:
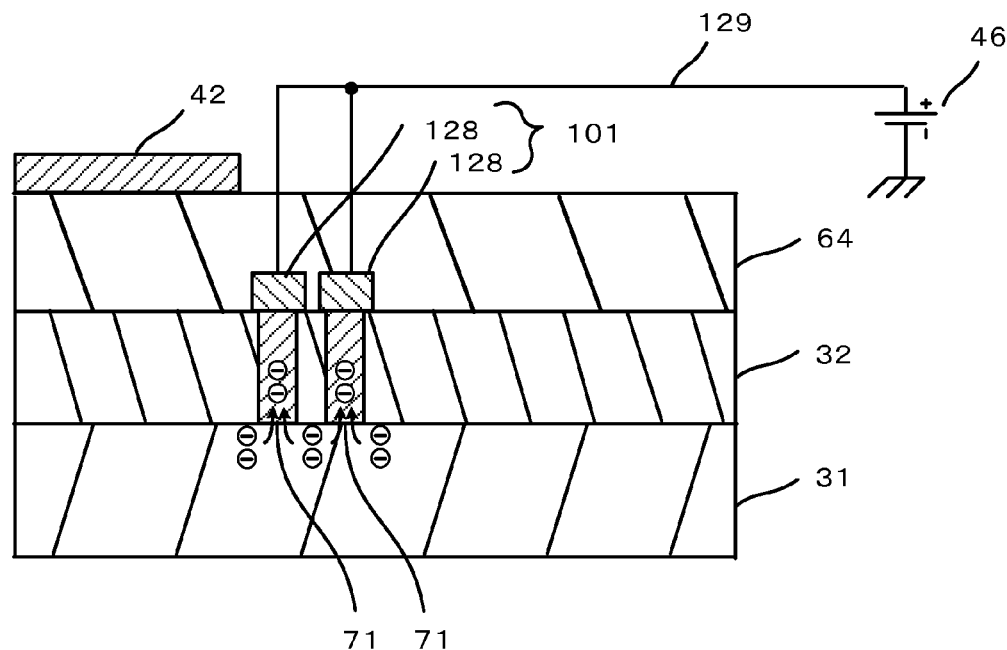

The bias line 101 having the wiring lines extending in the X direction and the vias 71 may be electrically connected to each other. FIGS. 24A and 24B are diagrams showing the bias line 101 having the wiring lines that extend in the X direction and are electrically connected to the vias 71. FIG. 24A is a plan view of the bias line 101 and FIG. 24B is a cross-sectional view taken along the line A-A of FIG. 24A and viewed in a direction of arrow.

As shown in FIGS. 24A and 24B, the bias line 101 has the wiring lines 128 provided on the silicon oxide film 32 and obliquely below the radio frequency transmission line 42. The wiring lines 128 extend in the X direction (θ1=90°). The vias 71 are arranged below the wiring lines 128 and are in contact with the wiring lines 128.

One end of each of the wiring lines 128 is connected commonly to the extraction wiring line 129 and the other end of each wiring line is opened. The extraction wiring line 129 is connected directly to the power supply 46. The wiring line 128 and the via 71 are electrically connected to each other. The power supply 46 applies a positive voltage to the wiring line 128 and the via 71.

In addition, the bias line 101 shown in FIGS. 23A and 23B and the via 61 shown in FIGS. 8A and 8B can be combined. The bias line 101 shown in FIGS. 24A and 24B and the via 61 shown in FIGS. 8A and 8B can be combined.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

(Note 1) The semiconductor switch circuit according to claim 1,
wherein the semiconductor switch unit has a field effect transistor and the first conductor is formed of the same material as a gate wiring line of the field effect transistor.
(Note 2) The semiconductor switch circuit according to claim 1,
wherein the semiconductor switch unit has a field effect transistor and the first conductor is formed of the same material as a channel layer of the field effect transistor.
(Note 3) The semiconductor switch circuit according to claim 7,
wherein the second conductor has a plurality of second columnar objects provided in the insulating film.
(Note 4) The semiconductor switch circuit according to claim 7,
wherein the second conductor has a plurality of second columnar objects that penetrate the insulating film to contact the semiconductor substrate.
(Note 5) The semiconductor switch circuit according to claim 7,
wherein a region in which the second conductor is provided extends to be closer to the outside than an edge of the second wiring line in plan view.
(Note 6) The semiconductor switch circuit according to claim 7,
wherein a potential of the second conductor is higher than a potential of the semiconductor substrate.
(Note 7) The semiconductor switch circuit according to claim 15
wherein a potential of the first conductor is substantially equal to a reference potential in a frequency band of a signal passing through the first wiring line.

What is claimed is:
1. A semiconductor switch circuit, comprising:
a semiconductor substrate;
an insulating film on the semiconductor substrate;

a semiconductor layer on the insulating film;
a semiconductor switch unit in the semiconductor layer, the semiconductor switch unit comprising a first switch portion comprising first transistors connected in series between a common terminal and a first terminal, and a second switch portion comprising second transistors connected in series between the first terminal and a ground terminal;
a first wiring line provided above the insulating film and electrically connected to the semiconductor switch unit; and
a conductor provided between the first wiring line and the semiconductor substrate.

2. The semiconductor switch circuit according to claim 1, wherein the conductor is connected to a power supply through a resistor.

3. The semiconductor switch circuit according to claim 1, wherein the conductor is isolated from the first wiring line.

4. The semiconductor switch circuit according to claim 3, wherein the conductor comprises a plurality of objects disposed apart from each other.

5. The semiconductor switch circuit according to claim 3, further comprising:
a second wiring line electrically connected to the first transistors, wherein the conductor and the second wiring line are arranged on the same place.

6. The semiconductor switch circuit according to claim 3, wherein the conductor is located immediately below the first wiring line.

7. The semiconductor switch circuit according to claim 3, further comprising:
an interlayer insulating film provided adjacent to the semiconductor layer, wherein
the first wiring line is provided on the interlayer insulating film.

8. The semiconductor switch circuit according to claim 3, wherein the semiconductor switch circuit comprises a radio frequency switch circuit.

9. The semiconductor switch circuit according to claim 1, wherein the conductor is electrically isolated from the first wiring line.

10. The semiconductor switch circuit according to claim 9, wherein the conductor comprises a plurality of objects disposed apart from each other.

11. The semiconductor switch circuit according to claim 9, further comprising:
a second wiring line electrically connected to the first transistors, wherein
the conductor and the second wiring line are arranged on the same plane.

12. The semiconductor switch circuit according to claim 9, wherein the conductor is located immediately below the first wiring line.

13. The semiconductor switch circuit according to claim 9, further comprising:
an interlayer insulating film provided adjacent to the semiconductor layer, wherein
the first wiring line is provided on the interlayer insulating film.

14. The semiconductor switch circuit according to claim 10, wherein the semiconductor switch circuit comprises a radio frequency switch circuit.

15. The semiconductor switch circuit:
a semiconductor substrate;
an insulating film on the semiconductor substrate;
a semiconductor layer on the insulating film;
a semiconductor switch unit in the semiconductor layer, the semiconductor switch unit comprising a first switch portion comprising first transistors connected in series between a common terminal and a first terminal, and a second switch portion comprising second transistors connected in series between the first terminal and a ground terminal;
a first wiring line provided above the insulating film and electrically connected to the semiconductor switch unit with a terminal; and
a conductor provided on the insulating film and isolated from the first wiring line.

16. The semiconductor switch circuit according to claim 15, wherein the conductor is connected to a power supply through a resistor.

17. The semiconductor switch circuit according to claim 15, wherein the conductor is electrically isolated from the first wiring line.

18. The semiconductor switch circuit according to claim 15, wherein the conductor comprises a plurality of objects disposed apart from each other.

19. The semiconductor switch circuit according to claim 15, further comprising:
an interlayer insulating film provided between the insulating film and the conductor.

* * * * *